United States Patent
Najafi

(10) Patent No.: US 10,573,800 B1
(45) Date of Patent: Feb. 25, 2020

(54) SUPERCONDUCTOR-TO-INSULATOR DEVICES

(71) Applicant: PSIQuantum Corp., Palo Alto, CA (US)

(72) Inventor: Faraz Najafi, Palo Alto, CA (US)

(73) Assignee: PSIQUANTUM CORP., Palo Alto, CA (US)

(*) Notice: Subject to any disclaimer, the term of this patent is extended or adjusted under 35 U.S.C. 154(b) by 0 days.

(21) Appl. No.: 16/107,143

(22) Filed: Aug. 21, 2018

(51) Int. Cl.
| H01L 41/02 | (2006.01) |
| H01L 39/10 | (2006.01) |
| H01L 39/24 | (2006.01) |
| H01L 39/16 | (2006.01) |
| H01L 39/12 | (2006.01) |

(52) U.S. Cl.
CPC ............. *H01L 39/10* (2013.01); *H01L 39/12* (2013.01); *H01L 39/16* (2013.01); *H01L 39/24* (2013.01)

(58) Field of Classification Search
CPC ......... H01L 39/10; H01L 39/12; H01L 39/16; H01L 39/24
USPC .......................................................... 310/328
See application file for complete search history.

(56) References Cited

U.S. PATENT DOCUMENTS

| 3,059,196 A | 10/1962 | Lentz |
| 3,119,076 A | 1/1964 | Schlig et al. |
| 4,365,317 A | 12/1982 | Gheewala |
| 4,509,146 A | 4/1985 | Wang et al. |
| 4,647,954 A | 3/1987 | Graf et al. |
| 5,026,682 A | 6/1991 | Clark et al. |
| 5,030,614 A | 7/1991 | Hollander et al. |
| 5,030,617 A * | 7/1991 | Legge ............... H01L 39/10 257/39 |
| 5,041,880 A | 8/1991 | Nojima et al. |

(Continued)

FOREIGN PATENT DOCUMENTS

| CN | 106549099 | 3/2017 |
| DE | 2440576 B1 | 1/1976 |

(Continued)

OTHER PUBLICATIONS

Akhlaghi et al., "Gated Mode Superconducting Nanowire Single Photon Detectors," Optics Express, vol. 20, No. 2, Jan. 16, 2012, 9 pgs.

(Continued)

*Primary Examiner* — Derek J Rosenau
(74) *Attorney, Agent, or Firm* — Morgan, Lewis & Bockius LLP

(57) ABSTRACT

The various embodiments described herein include methods, devices, and systems for fabricating and operating superconducting switch devices. In one aspect, an electrical circuit includes: (1) a switch device configured to switch between an on state and an off state in response to a first voltage, the switch device comprising: (a) a superconductor layer adapted to transition from a superconducting state to an insulating state in response to a first strain; and (b) a piezoelectric layer positioned adjacent to the superconductor layer, the piezoelectric layer configured to apply the first strain to the superconductor layer in response to the first voltage; (2) a voltage source electrically coupled to the piezoelectric layer of the switch device and configured to supply the first voltage; and (3) an output component coupled to the superconductor layer of the switch device.

36 Claims, 14 Drawing Sheets

(56) References Cited

U.S. PATENT DOCUMENTS

| | | |
|---|---|---|
| 5,051,787 A | 9/1991 | Hasegawa |
| 5,219,826 A | 6/1993 | Kapitulnik |
| 5,247,475 A | 9/1993 | Hasunuma et al. |
| 5,365,476 A | 11/1994 | Mukhanov |
| 5,455,519 A | 10/1995 | Ohori |
| 5,481,119 A | 1/1996 | Higashino et al. |
| 5,521,862 A | 5/1996 | Frazier |
| 5,825,240 A | 10/1998 | Geis et al. |
| 5,831,278 A | 11/1998 | Berkowitz |
| 6,078,517 A | 6/2000 | Herr |
| 6,242,939 B1 | 6/2001 | Nagasawa |
| 6,433,974 B2 | 8/2002 | Heismann |
| 6,774,463 B1 | 8/2004 | Chaudhari et al. |
| 7,513,765 B2 | 4/2009 | Liao |
| 7,558,030 B2 | 7/2009 | Lee et al. |
| 7,724,083 B2 | 5/2010 | Herring et al. |
| 7,852,106 B2 | 12/2010 | Herr et al. |
| 8,330,145 B2 | 12/2012 | Wakana et al. |
| 9,443,576 B1 | 9/2016 | Miller |
| 9,500,519 B2 | 11/2016 | Tang et al. |
| 9,876,505 B1 | 1/2018 | Dai et al. |
| 9,998,122 B2 | 6/2018 | Hamilton et al. |
| 10,103,736 B1 | 10/2018 | Powell et al. |
| 10,171,086 B2 | 1/2019 | McCaughan |
| 10,186,858 B2 | 1/2019 | Klaus et al. |
| 10,197,440 B2 | 2/2019 | Najafi |
| 2005/0153843 A1 | 7/2005 | Kubota |
| 2010/0026447 A1 | 2/2010 | Keefe et al. |
| 2010/0171098 A1 | 7/2010 | Suzuki |
| 2011/0254053 A1 | 10/2011 | Goupil et al. |
| 2013/0143744 A1 | 6/2013 | Marsili et al. |
| 2014/0299751 A1 | 10/2014 | Tang et al. |
| 2016/0028403 A1 | 1/2016 | McCaughan et al. |
| 2017/0186933 A1 | 6/2017 | Sunter et al. |
| 2018/0145664 A1 | 5/2018 | Herr et al. |
| 2019/0035999 A1 | 1/2019 | Najafi |

FOREIGN PATENT DOCUMENTS

| | | |
|---|---|---|
| EP | 0299879 A2 | 1/1989 |
| GB | 2530500 A | 3/2016 |
| JP | S63299282 A | 12/1988 |
| JP | H05-55647 A | 3/1993 |
| WO | WO90/14715 A1 | 11/1990 |
| WO | WO94/09566 A1 | 4/1994 |

OTHER PUBLICATIONS

Atikian, Haig A. et al., "Superconducting Nanowire Single Photon Detector on Diamond," arXiv:1401.4490v1, physics.optics, Jan. 17, 2014, 5 pgs.

Chen, Risheng et al., "Photon-Number-Resolving Detector Based on Superconducting Serial Nanowires," IEEE Transactions on Applied Superconductivity, vol. 23, No. 1, Feb. 2013, 9 pgs.

Clem, John R. et al., "Geometry-dependent critical currents in superconducting nanocircuits," arXiv:1109.4881v1 [cond-mat.supr-con] Sep. 22, 2011, 29 pgs.

Dai, Daoxin et al., "Mode conversion in tapered submicron silicon ridge optical waveguides," Optics Express, vol. 20, No. 12, Jun. 4, 2012, 15 pgs.

Henrich, D. et al., "Geometry-inducted reduction of the critical current in superconducting nanowires," arXiv:1204.0616v2 [cond-mat-supr-con] Aug. 22, 2012, 6 pgs.

Hortensius, H.L. et al., "Critical-Current Reduction in Thin Superconducting Wires Due to Current Crowding," arXiv:1203.4253v3, [cond-mat-supr-con], May 6, 2012, 5 pgs.

Korzh, B.A. et al., "Demonstrating sub-3 ps temporal resolution in a superconducting nanowire single-photon detector," Apr. 18, 2018, 26 pgs.

Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S0167931701004269).

Marsili, F., "Single-photon detectors based on ultra-narrow superconducting nanowires," Massachusetts Institute of Technology, Department of Electrical Engineering and Computer Science, Dec. 19, 2010, 31 pgs.

Mattioli, Francesco et al., "Photon-number-resolving superconducting nanowire detectors," Superconductor Science and Technology, Aug. 24, 2015, 16 pgs.

McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosopy in Electrical Engineering, 22 pgs.

Murphy et al., "Nanoscale superconducting memory based on the kinetic inductance of asymmetric nanowire loops," Departmwent of Physics, University of Illinois at Urbana-Champaign, arXiv:1701.08715v2 [cond-mat.supr-con] Jun. 29, 2017, 19 pgs.

Nataraj an et al., "Superconducting nanowire single-photon detectors: physics and applications", 2012, Superconduc. Sci. Technology vol. 25, p. 063001.

Quaranta et al., Superconductive Three-Terminal Amplifier/Discriminator, IEEE Transactions on Applied Superconductivity, vol. 19, No. 3, Jun. 2, 2009, 4 pgs.

Schmidt, E. et al., AIN-Buffered Superconducting NbN Nanowire Single-Photon Detector on GaAs, IEEE Transactions on Applied Superconductivity, vol. 27, No. 4, Jun. 2017, 5 pgs.

Shiino, Tatsuya et al., "Improvement of Critical Temperature of Superconducting NbTiN and NbN Thin Films Using the AIN Buffer Layer," Superconductor Science and Technology, Mar. 2010, 11 pgs.

Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.

PsiQuantum Corp., International Search Report and Written Opinion, PCT/US2018/033042, dated Aug. 28, 2018, 13 pgs.

PsiQuantum Corp., International Search Report and Written Opinion, PCT/US2018/033041, dated Jul. 27, 2018, 16 pgs.

PsiQuantum Corp., International Search Report and Written Opinion, PCT/US2018/044091, dated Nov. 7, 2018, 13 pgs.

PsiQuantum Corp., Invitation to Pay Additional Fees/Partial Search Report, PCT/US2018/037892, dated Aug. 20, 2018, 16 pgs.

PsiQuantum Corp., Invitation to Pay Additional Fees/Partial Search Report, PCT/US2018/054414, dated Jan. 24, 2019, 21 pgs.

Najafi, Office Action dated Dec. 12, 2018, U.S. Appl. No. 16/028,288, 6 pgs.

Najafi, Office Action dated Sep. 21, 2018, U.S. Appl. No. 16/028,293, 8 pgs.

Najafi, Final Office Action dated Mar. 1, 2019 U.S. Appl. No. 16/028,293, 5 pgs.

Najafi, Notice of Allowance dated Sep. 21, 2018, U.S. Appl. No. 16/012,520, 9 pgs.

Najafi, Quayle Office Action, U.S. Appl. No. 16/151,180, dated Jan. 31, 2019, 5pgs.

Najafi, Notice of Allowance U.S. Appl. No. 16/151,190, dated Feb. 6, 2019, 11 pgs.

Najafi, Office Action, U.S. Appl. No. 16/046,815, dated Feb. 4, 2019, 9 pgs.

PsiQuantum Corp., Invitation to Pay Additional Fees/Partial Search Report, PCT/US2018/037892, dated Aug. 20, 2018, 18 pgs.

PsiQuantum Corp., International Search Report and Written Opinion, PCT/US2018/054414, dated Mar. 20, 2019, 21 pgs.

Najafi, Notice of Allowance dated Apr. 5, 2019, U.S. Appl. No. 16/028,288, 10 pgs.

Najafi, Office Action, U.S. Appl. No. 16/136,124, dated Apr. 4, 2019, 9 pgs.

Najafi, Notice of Allowance U.S. Appl. No. 16/151,190, dated Mar. 28, 2019, 5 pgs.

Najafi, Office Action, U.S. Appl. No. 16/046,807, dated Mar. 18, 2019, 10 pgs.

(56) References Cited

OTHER PUBLICATIONS

Najafi, Notice of Allowance, U.S. Appl. No. 16/151,180, dated Mar. 14, 2019, 5 pgs.

* cited by examiner

SUPERCONDUCTOR-TO-INSULATOR DEVICES

TECHNICAL FIELD

This relates generally to superconducting devices, including but not limited to, devices utilizing both superconducting and insulating states.

BACKGROUND

Superconductors are materials capable of operating in a superconducting state with zero electrical resistance under particular conditions. Superconductors are also capable of operating in a non-superconducting (conducting) state, and some superconductors are further capable of operating in an insulating state.

SUMMARY

There is a need for systems and/or devices with more efficient and effective methods for providing the functionality of a switch. Such systems, devices, and methods optionally complement or replace conventional systems, devices, and methods for providing the functionality of a switch.

The present disclosure describes superconducting switch devices that utilize a non-thermal phase transition from a superconducting state to an insulating state (e.g., rather than a thermal transition to a non-superconducting conductive state). In some embodiments, the transition to the insulating state is in response to a lattice strain (e.g., applied via a coupled piezoelectric component). In some circumstances and embodiments, utilizing the superconducting-to-insulating transition (SIT) reduces latching of the switch, enables the switch to operate at higher speeds, and/or lowers power consumption of the switch.

In one aspect, some embodiments include an electrical circuit including: (1) a switch device configured to switch between an on state and an off state in response to a first voltage, the switch device including: (a) a superconductor layer adapted to transition from a superconducting state to an insulating state in response to a first strain; and (b) a piezoelectric layer positioned adjacent to the superconductor layer, the piezoelectric layer configured to apply the first strain to the superconductor layer in response to the first voltage; (2) a voltage source electrically coupled to the piezoelectric layer of the switch device and configured to supply the first voltage; and (3) an output component coupled to the superconductor layer of the switch device.

In another aspect, some embodiments include a method of operating a switch. The method including: (1) operating a switch device in an on state by maintaining a superconductor layer of the switch device in a superconducting state; and (2) switching operation of the switch device from the on state to an off state by transitioning the superconductor layer to an insulating state.

In yet another aspect, some embodiments include a method of fabricating a superconducting switch device. The method including: (1) obtaining a substrate; (2) depositing a layer of superconductor material on the substrate; (3) removing one or more portions of the layer of the superconductor material to define one or more wires; and (4) depositing a piezoelectric layer over the superconductor material. In some embodiments, the piezoelectric layer is deposited before the superconductor layer. In some embodiments, the substrate is composed of a piezoelectric material. In yet another aspect, some embodiments include devices and circuits for performing any of the methods described herein.

Thus, devices and circuits are provided with methods for operating superconducting switch devices, thereby increasing the effectiveness, efficiency, accuracy, precision, and user satisfaction with such circuits and devices.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

The present disclosure describes operating superconducting switch devices to utilize a non-thermal phase transition from a superconducting state and a high-resistance insulating state (e.g., rather than a thermal transition to a non-superconducting conductive state). In some embodiments, the superconductor is adapted to transition between the superconducting state and the insulating state by having a thickness slightly above a superconducting thickness threshold, e.g., within 5 nanometers (nm), 10 nm, or 20 nm of the superconducting thickness threshold.

Figure 1A:
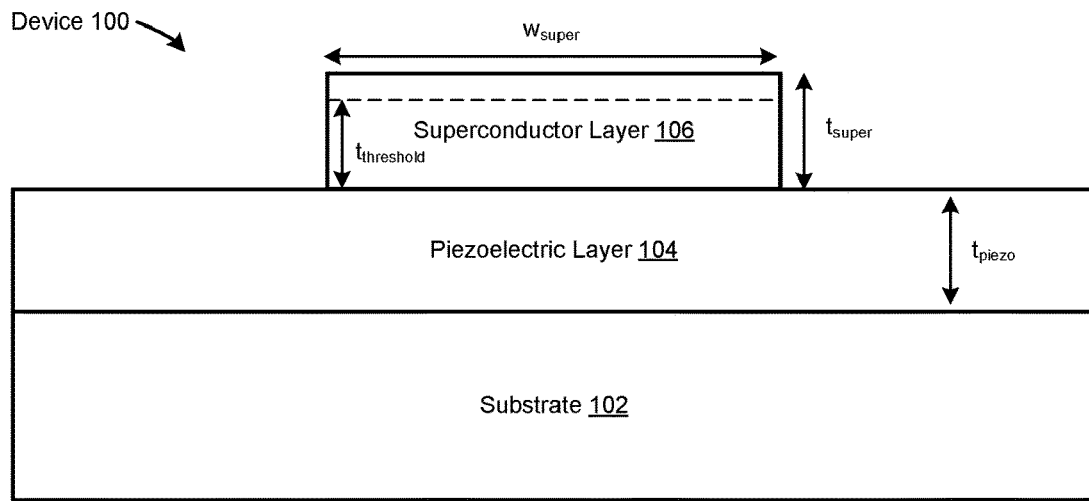
FIGS. 1A-1C are cross-sectional diagrams illustrating representative layering for superconducting switch devices in accordance with some embodiments.
Figure 1B:
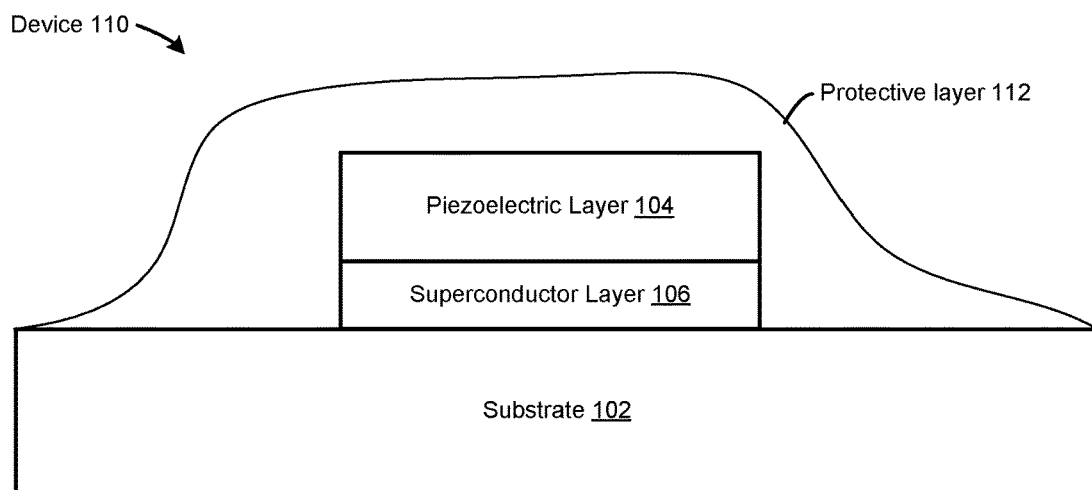
Figure 1C:
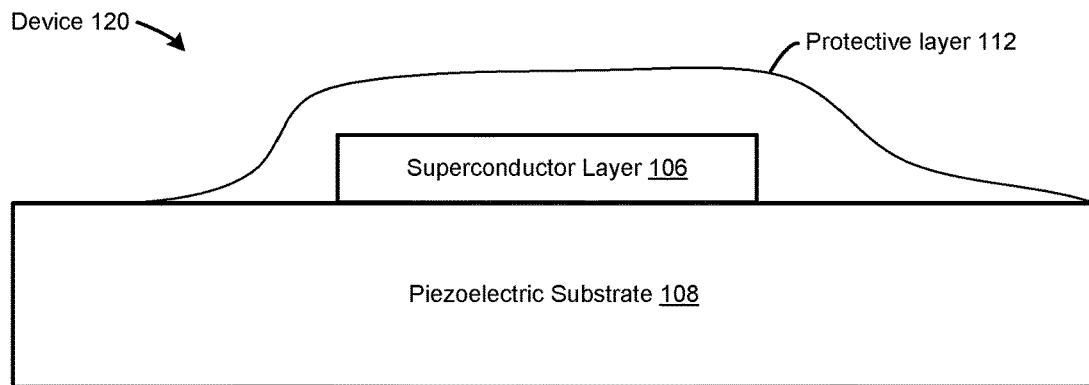

FIGS. 1A-1C are cross-sectional diagrams illustrating representative layering for superconducting switch devices in accordance with some embodiments. FIG. 1A shows a switch device 100 including a piezoelectric layer 104 (e.g., composed of aluminum nitride (AlN)) on a substrate 102 (e.g., composed of silicon) and a superconductor layer 106 (e.g., composed of niobium nitride (NbN)) on the piezoelectric layer 104. In some embodiments, the piezoelectric layer 104 has a thickness, denoted $t_{piezo}$, in the range of 5 nm to 20 nm. In some embodiments, the superconductor layer 106 has a width, denoted $w_{super}$, in the range of 50 nm to 5 micron (μm). In some embodiments, the superconductor layer 106 is, or includes, a superconductor wire. In some embodiments, the superconductor layer 106 has a length in the range of 100 nm to 100 μm. In some embodiments, the superconductor layer 106 has a thickness, denoted $t_{super}$, in the range of 5 nm to 20 nm.

FIG. 1A also shows a superconducting thickness threshold, denoted $t_{threshold}$, for the superconductor. The superconducting thickness threshold corresponds to a minimum thickness of the superconductor layer 106 necessary for the superconductor layer 106 to operate in a superconducting state. For example, a superconductor layer having a thickness above the superconducting thickness threshold operates in a superconducting state in certain circumstances (e.g., at temperatures below a superconducting threshold temperature), whereas a superconductor layer having a thickness below the superconducting thickness threshold operates in an insulating state in those same circumstances. In some circumstances, the superconducting thickness threshold is based on a superconducting material, structure, and/or strain of the superconductor layer. For example, niobium nitride (NbN) may have a superconducting thickness threshold in the range of 1 nm to 3 nm. In some embodiments, the device 100 further includes a protective layer over the superconductor layer 106.

FIG. 1B shows a switch device 110, which is similar to the switch device 100 except for the ordering of the layers. FIG. 1B shows the switch device 110 including the superconductor layer 106 on the substrate 102 and the piezoelectric layer 104 on the superconductor layer 106. FIG. 1C shows a switch device 120 including the superconductor layer 106 on a piezoelectric substrate 108 (e.g., composed of AlN).

In accordance with some embodiments, FIGS. 1B-1C further show a protective layer 112 over the superconductor layer 106. In some embodiments, the protective layer 112 is an insulating layer. In some embodiments, the protective layer 112 is adapted to inhibit oxidation of the superconductor layer 106 (e.g., the protective layer 112 is not composed of oxygen). For example, the protective layer 112 is composed of aluminum nitride. In some embodiments, the protective layer 112 is, or includes, a dielectric material. In some embodiments, the protective layer 112 is a carbon-based dielectric material. In some embodiments, the protective layer 112 is, or includes, a passivation layer. In some embodiments, the protective layer 112 is a thin film (e.g., has a thickness between 5 nm and 50 nm).

Figure 2A:
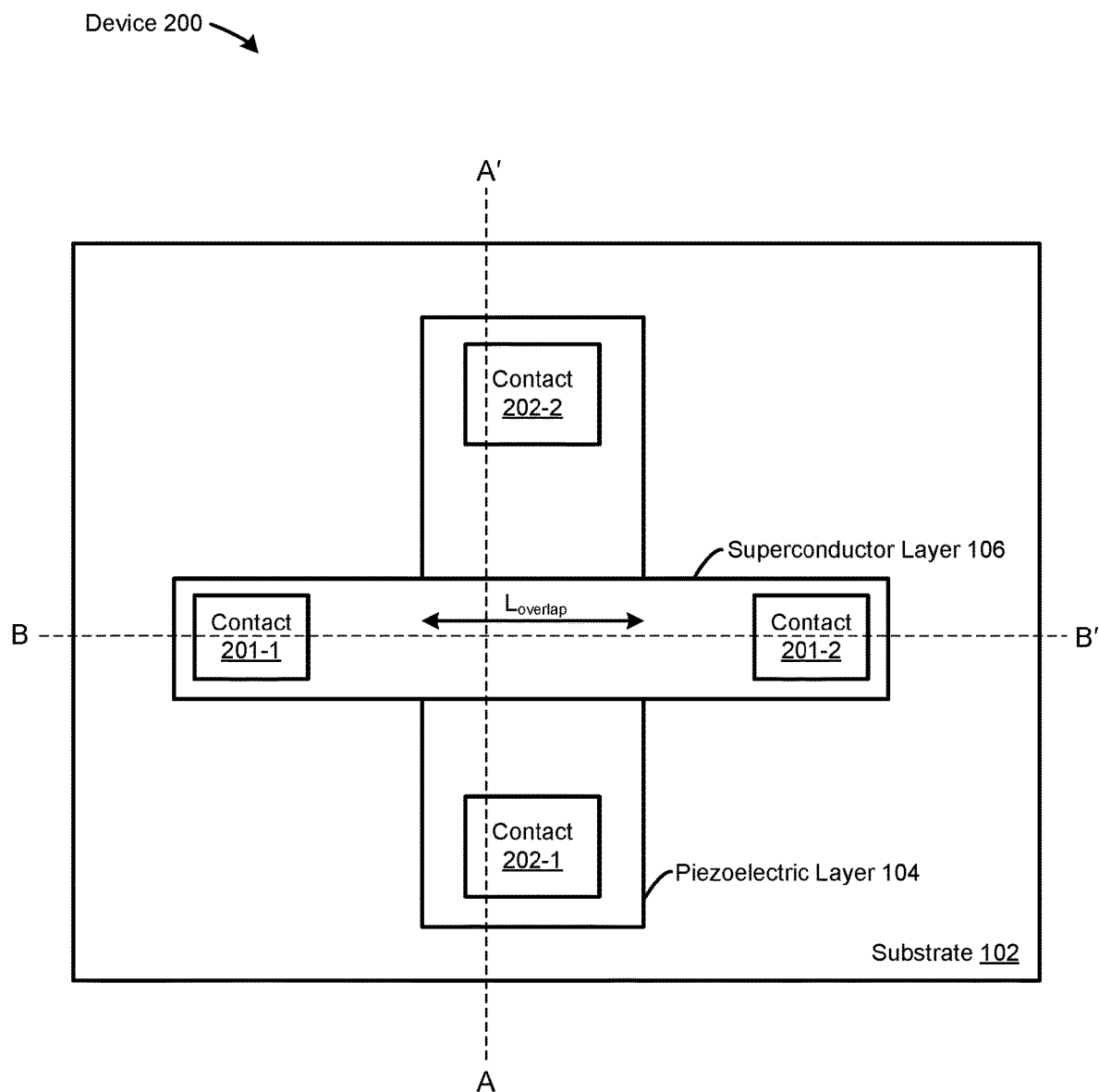
FIG. 2A is a top-down plan view diagram illustrating a superconducting switch device in accordance with some embodiments.

FIG. 2A is a top-down plan view diagram illustrating a superconducting switch device 200 in accordance with some embodiments. FIG. 2A shows the piezoelectric layer 104 on the substrate 102 and the superconductor layer 106 on the piezoelectric layer 104. FIG. 2A also shows the contacts 202 (e.g., contacts 202-1 and 202-2) on the piezoelectric layer 104 and the contacts 201 (e.g., contacts 201-1 and 201-2) on the superconductor layer 106. FIG. 2A further shows a B-B' axis and an A-A' axis perpendicular to the B-B' axis. In some embodiments, the contacts 201 and 202 are composed of metal and/or other conducting materials. In some embodiments, the piezoelectric layer 104 and the superconductor layer 106 are arranged to be substantially perpendicular to one another (e.g., within 5 degrees, 10 degrees, or 20 degrees of perpendicular).

Figure 2B:
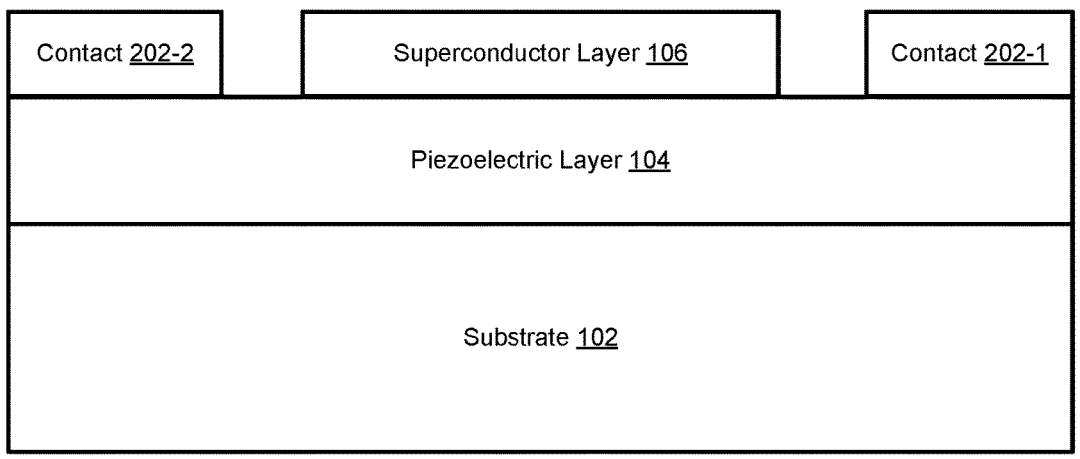
FIGS. 2B-2C are cross-sectional diagrams illustrating layering of the superconducting device of FIG. 2A in accordance with some embodiments.
Figure 2C:
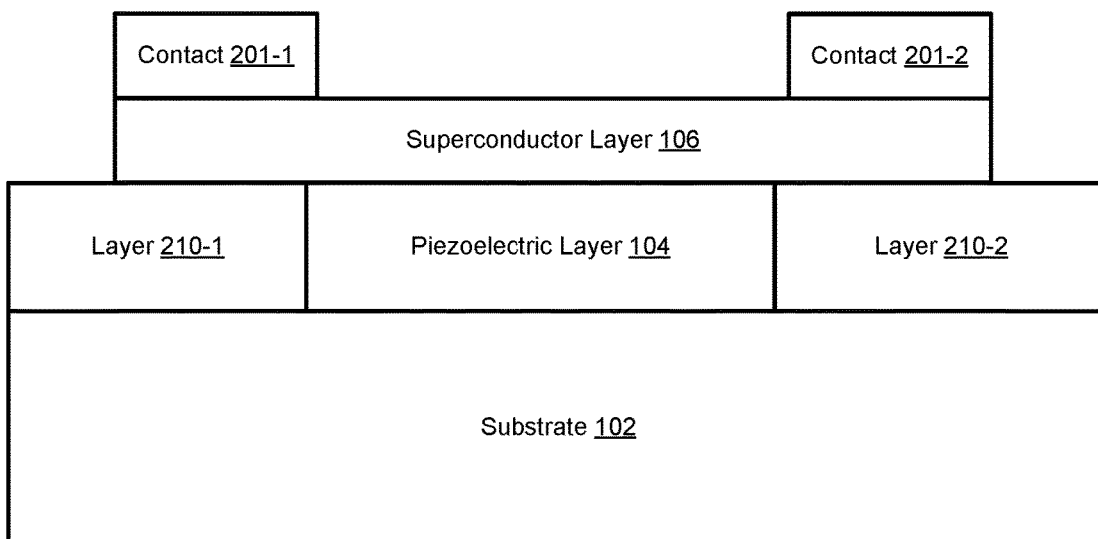

FIGS. 2B-2C are cross-sectional diagrams illustrating layering of the superconducting device of FIG. 2A in accordance with some embodiments. Specifically, FIG. 2B shows a cross-sectional view along the A-A' axis and FIG. 2C shows a cross-sectional view along the B-B' axis. FIG. 2C shows the superconductor layer 106 on the piezoelectric layer 104 and layers 210 (e.g., layers 210-1 and 210-2). In some embodiments, layers 210 are piezoelectric layers. In some embodiments, the layers 210 are composed of a dielectric material (e.g., silicon). In some embodiments, the layers 210 have a high refractive index (e.g., a refractive index above 2 or 3). In some embodiments, the layers 210 are protective layers adapted to inhibit oxidation of the superconductor layer 106. In some embodiments, the layers 210 are insulating layers. In some embodiments, the piezoelectric layer 104 extends in the B-B' direction (i.e., a direction parallel to the B-B' axis) at least as far as the superconductor layer 106. In some embodiments, the superconductor layer 106 and the piezoelectric layer 104 are sized and positioned such that an overlapping portion of the superconductor layer 106 has a length, denoted $L_{overlap}$, that is greater than a superconducting coherence length of the superconductor layer 106 (e.g., to inhibit tunneling effects of cooper pairs). For example, $L_{overlap}$ is two, four, or six times the superconducting coherence length. In some embodiments (not shown), a trench is etched in the substrate 102 and the piezoelectric layer 104 is deposited into the trench, and thus the layers 210 are not needed or present. In some embodiments (not shown), the piezoelectric layer 104 is the substrate (e.g., as illustrated in FIG. 1C) and the contacts 202 are connected to the piezoelectric substrate.

Figure 3A:
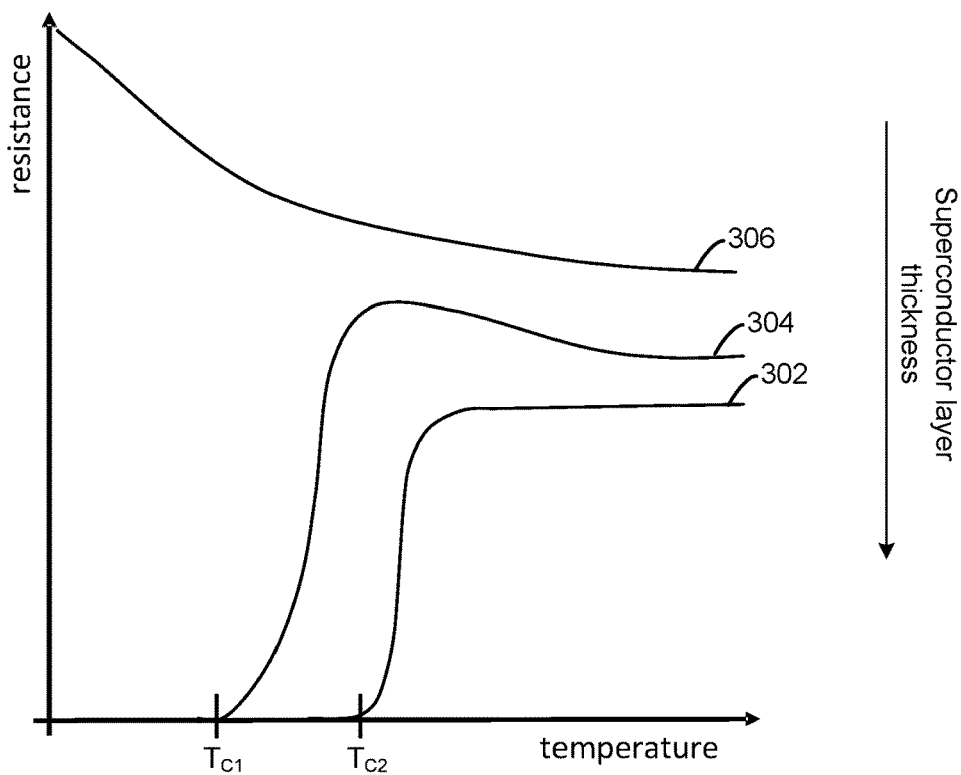
FIGS. 3A-3C are prophetic diagrams illustrating relationships between resistance and temperature for superconducting devices in accordance with some embodiments.
Figure 3B:
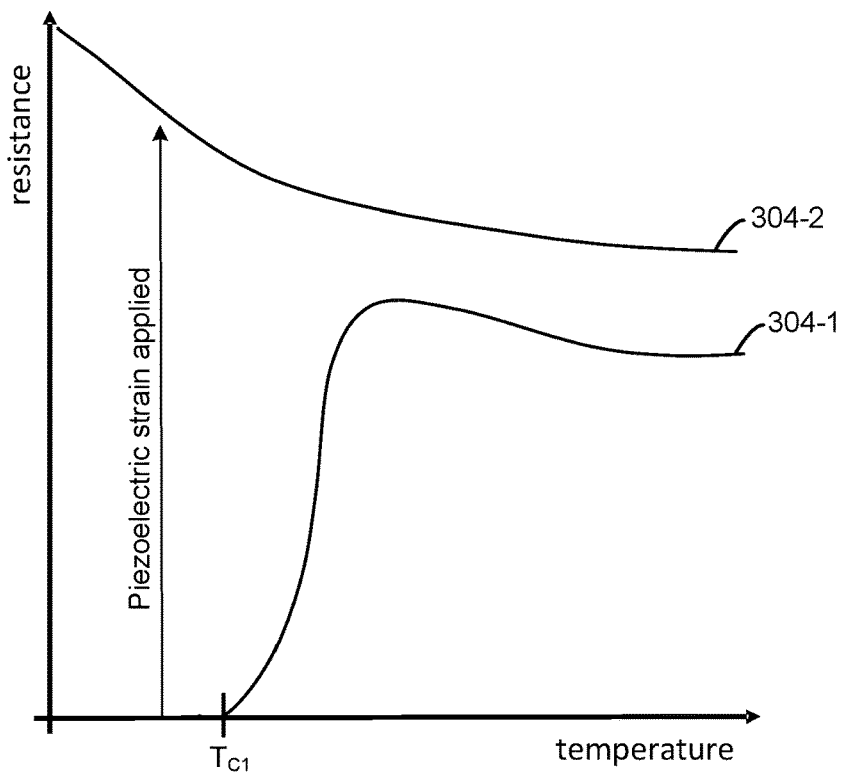
Figure 3C:
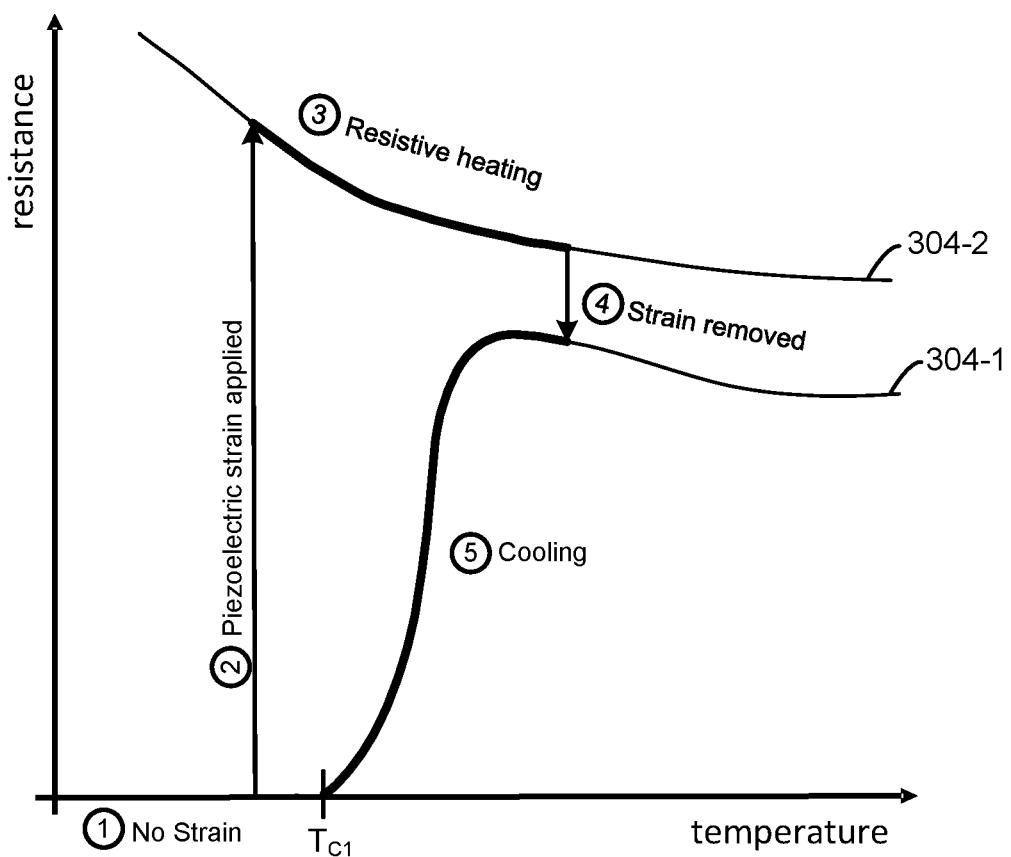

FIGS. 3A-3C are prophetic diagrams illustrating relationships between resistance and temperature for superconducting devices in accordance with some embodiments. FIG. 3A shows relationships between resistance and temperature for three superconductor layers 302, 304, 306. The superconductor layer 302 has a highest thickness and a corresponding highest superconducting temperature threshold, denoted $T_{C2}$. The superconducting temperature threshold $T_{C2}$ is a temperature at which the superconductor layer 302 transitions between a superconducting state (at temperatures below $T_{C2}$) and a non-superconducting conductive state (at temperatures above $T_{C2}$).

The superconductor layer 304 is thinner than the superconductor layer 302 and has a correspondingly lower superconducting temperature threshold, denoted $T_{C1}$. The superconductor layer 306 has the lowest thickness (is the thinnest), which is less than a superconducting thickness threshold. Thus, the superconductor layer 306 does not have a temperature range where it operates in a superconducting state, rather the superconductor layer 306 operates in an insulating state at temperatures below $T_{C1}$ and $T_{C2}$.

FIG. 3B shows a resistance and temperature relationship for a superconductor layer 304 with and without a strain applied to the superconductor layer. The curve 304-1 for the superconductor layer 304 is without a strain applied and corresponds to the curve 304 in FIG. 3A. The curve 304-2 for the superconductor layer 304 is with a strain applied (e.g., a piezoelectric strain) and corresponds to the superconductor layer 304 operating in an insulating state. Thus, FIGS. 3A-3B illustrate how a strain applied to a superconductor layer having a thickness just above a superconducting thickness threshold (e.g., within 5%, 10%, or 20% of the superconducting thickness threshold) may transition the superconductor layer from a superconducting state to an insulating state. In some embodiments, the superconductor layer is sized and positioned so that an insulating region created by the piezoelectric layer has a length that is longer than a superconducting coherence length of the superconductor layer (e.g., 5, 10, or 20 times as long as the coherence length), thus inhibiting electron tunneling through the insulating region.

FIG. 3C shows a prophetic operating sequence for the superconductor layer 304 in accordance with some embodiments. In the example of FIG. 3C, the superconductor layer 304 is initially operating in a superconducting state, denoted (1), at a first time. At a second time, a piezoelectric strain is applied to the superconductor 304 and the superconductor layer 304 transitions from the superconducting state to an insulating state, denoted (2). In the insulating state, the superconductor layer 304 is resistive and generates resistive heat as current supplied, denoted (3). At a second time, the strain is removed from the superconductor layer 304 and the superconductor layer 304 transitions from the insulating state to a non-superconducting conductive state, denoted (4). In the non-superconducting state, the superconductor layer 304 has less resistance than in the insulating state and thus generates less resistive heat. As a result of producing less heat, the superconductor layer 304 cools (e.g., with the aid of a cryostat or the like) until it transitions at $T_{C1}$ from the non-superconducting state back to the superconducting state. In accordance with some embodiments, after transitioning back to the superconducting state, the superconductor layer 304 is ready to be switched back to the insulating state via application of another piezoelectric strain.

Figure 4A:
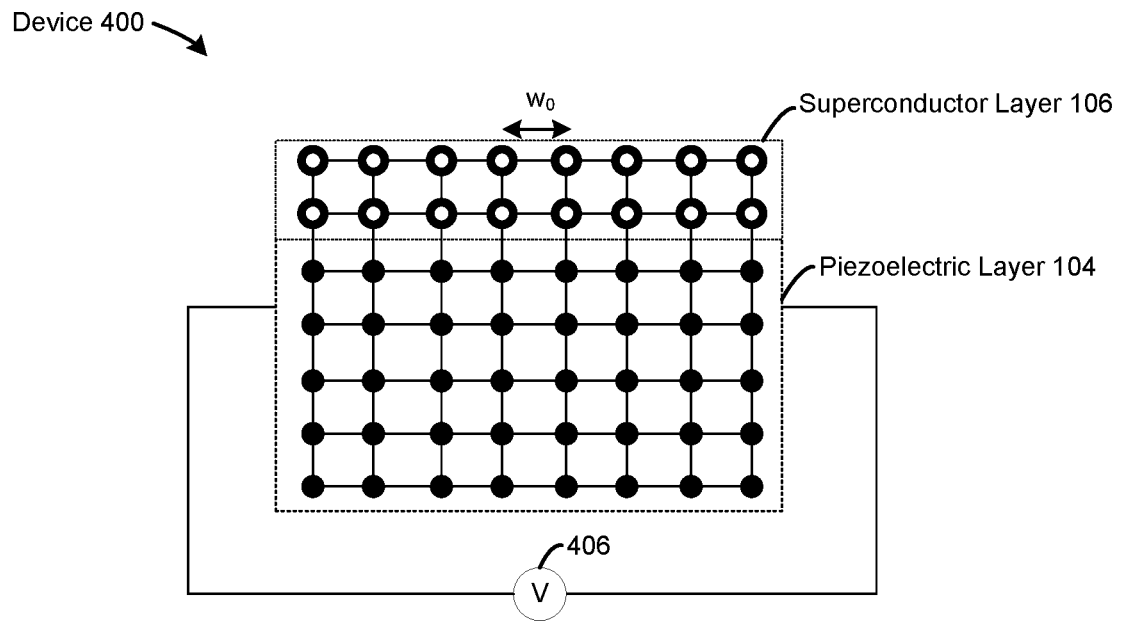
FIGS. 4A-4B are diagrams illustrating a lattice-strain applied on a superconductor layer by a piezoelectric layer in accordance with some embodiments.
Figure 4B:
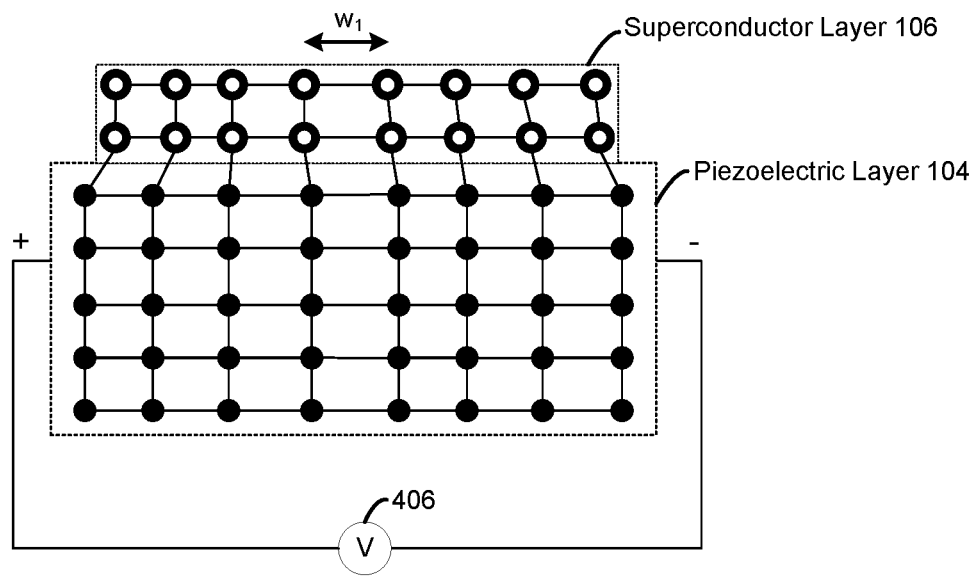

FIGS. 4A-4B are diagrams illustrating a lattice-strain applied on a superconductor layer by a piezoelectric layer in accordance with some embodiments. FIGS. 4A-4B show a device 400 including a piezoelectric layer 104 lattice-matched with a superconductor layer 106, e.g., the piezoelectric layer 104 and the superconductor layer 106 have a same or similar lattice constant (e.g., lattice constants within 5%, 10%, or 20% of one another) at the interface. FIGS. 4A-4B further show a voltage source 406 coupled to the piezoelectric layer 104. In some embodiments, the voltage source 406 is one or more circuit components that selectively output the first voltage (e.g., a photon detection circuit).

In FIG. 4A no voltage is supplied by the voltage source 406 and thus the superconductor layer 106 has no strain applied (e.g., corresponding to curve 304-1 in FIG. 3B) as illustrated by the distance $w_0$ between atoms in the superconductor layer 106. In FIG. 4B the voltage source 406 supplies a first voltage (e.g., a voltage between 100 millivolts (mV) and 1 volt) and the first voltage causes a horizontal expansion of the piezoelectric layer 104. The horizontal expansion of the piezoelectric layer 104 causes a strain to be applied to the lattice-matched superconductor layer 106 as illustrated by the distance $w_1$ (greater than $w_0$) between atoms in the superconductor layer 106. In accordance with some embodiments, the strain applied to the superconductor layer 106 is sufficient to transition the superconductor layer 106 from the superconducting state to the insulating state (as illustrated in FIGS. 3B and 3C). In some embodiments, the switch device 400 is configured such that, while in the insulating state, electron tunneling through the superconductor is inhibited. In some embodiments, the insulating portion of the superconductor has a length greater than a threshold tunneling distance (e.g., a superconducting coherence length) so as to inhibit electron tunneling from one side of the superconductor layer 106, across the insulating portion, to another side of superconductor layer 106. Although FIG. 4B shows the piezoelectric layer 104 expanding further than the superconductor layer 106, in some embodiments (not shown), at least a portion of the superconductor layer 106 expands a same amount as the piezoelectric layer 104.

Figure 5A:
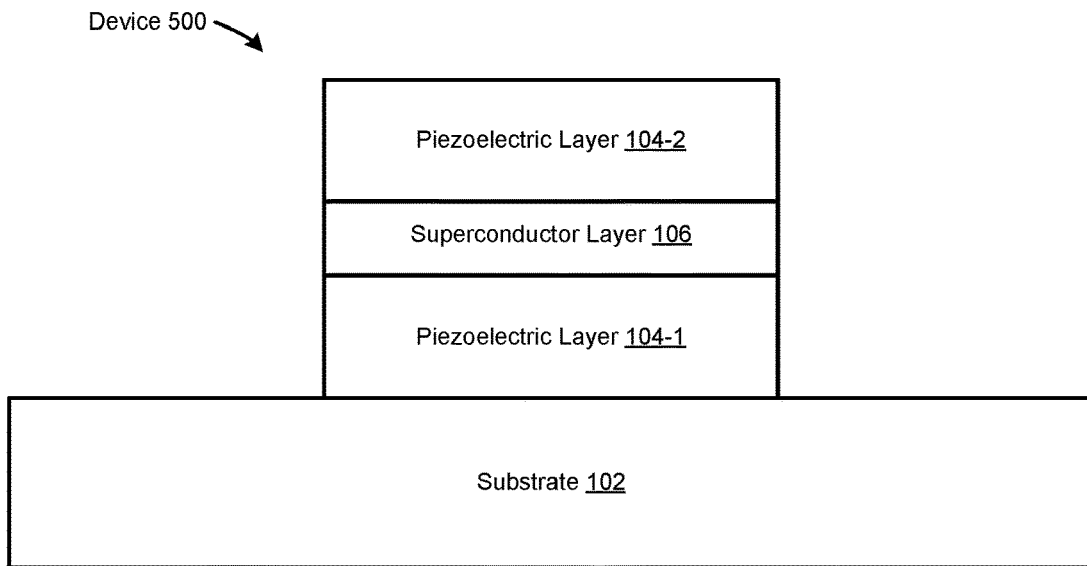
FIGS. 5A-5B are cross-sectional diagrams illustrating representative layering for superconducting switch devices in accordance with some embodiments.
Figure 5B:
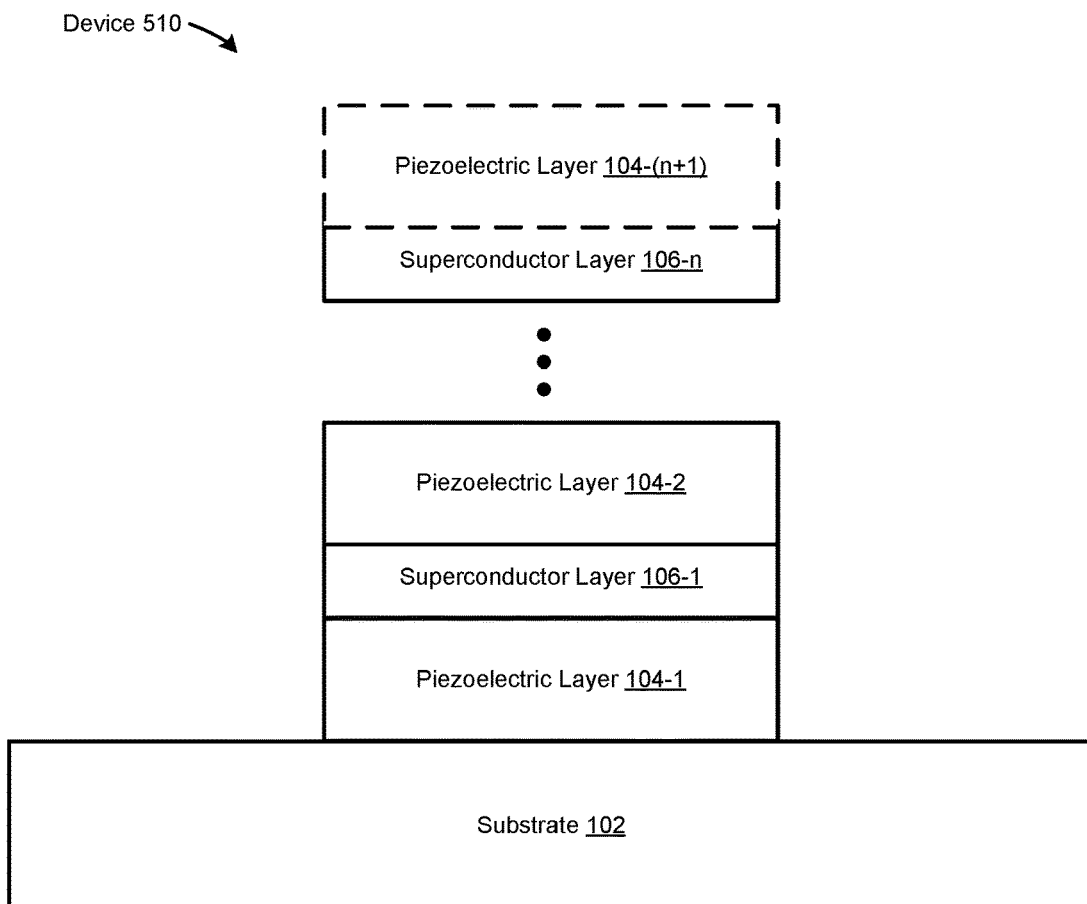

FIGS. 5A-5B are cross-sectional diagrams illustrating representative layering for superconducting switch devices in accordance with some embodiments. FIG. 5A shows a switch device 500 having two piezoelectric layers 104 coupled to the superconductor layer 106. In some embodiments, the piezoelectric layers 104-1 and 104-2 are coupled in parallel to a voltage source, such as voltage source 406. Thus, in response to a voltage supplied by the voltage source, each piezoelectric layer 104 applies a strain to the superconductor layer 106. In this way, more strain is applied to the superconductor layer 106 for a same voltage as compared to embodiments with a single piezoelectric layer. In other words, less voltage may be needed to achieve a same amount of strain on the superconductor layer 106 when using multiple piezoelectric layers 104 as opposed to a single piezoelectric layer (e.g., reducing power requirements and potentially extending device life).

FIG. 5B shows a switch device 510 having multiple superconductor layers 106 (e.g., layers 106-1 through 106-$n$) and multiple piezoelectric layers (e.g., layers 104-1 through 104-$n$ or 104-($n$+1)). For example, a switch device 510 optionally has two superconductor layers 106 and two or three piezoelectric layers 104. In some embodiments, each piezoelectric layer 104 is lattice-matched to adjacent superconductor layers 106. In some embodiments, the piezoelectric layers 104 are coupled in parallel with one another. In some embodiments, the superconductor layers 106 are coupled in parallel with one another. In some embodiments, the superconductor layers 106 are configured so as to transition from the non-superconducting state to the insulating state concurrently (e.g., in response to a strain applied by the piezoelectric layers 104). Thus embodiments described herein with reference to "a superconductor layer 106" of a switch device could apply equally to switch devices such as the switch device 510 having multiple superconductor layers 106.

As described above with respect to FIG. 5A, coupling the piezoelectric layers 104 in parallel with one another reduces an amount of voltage need in some circumstances and embodiments. In some embodiments each piezoelectric layer 104 has a same thickness, while in some other embodiments, at least one piezoelectric layer 104 has a different thickness than one or more other piezoelectric layers 104. In some embodiments, the piezoelectric layers 104 are coupled with a voltage source as to be supplied with a same voltage. In some embodiments, the piezoelectric layers 104 are coupled to one or more voltage sources. In some embodiments, the piezoelectric layers 104 are coupled with voltage source(s) so as to be supplied with distinct voltages, e.g., based on thicknesses of respective piezoelectric layers 104. In some embodiments, the devices 500 and 510 include a protective layer over the piezoelectric layers 104 and superconductor layers 106 (e.g., the protective layer 112 in FIG. 1B).

Figure 6A:
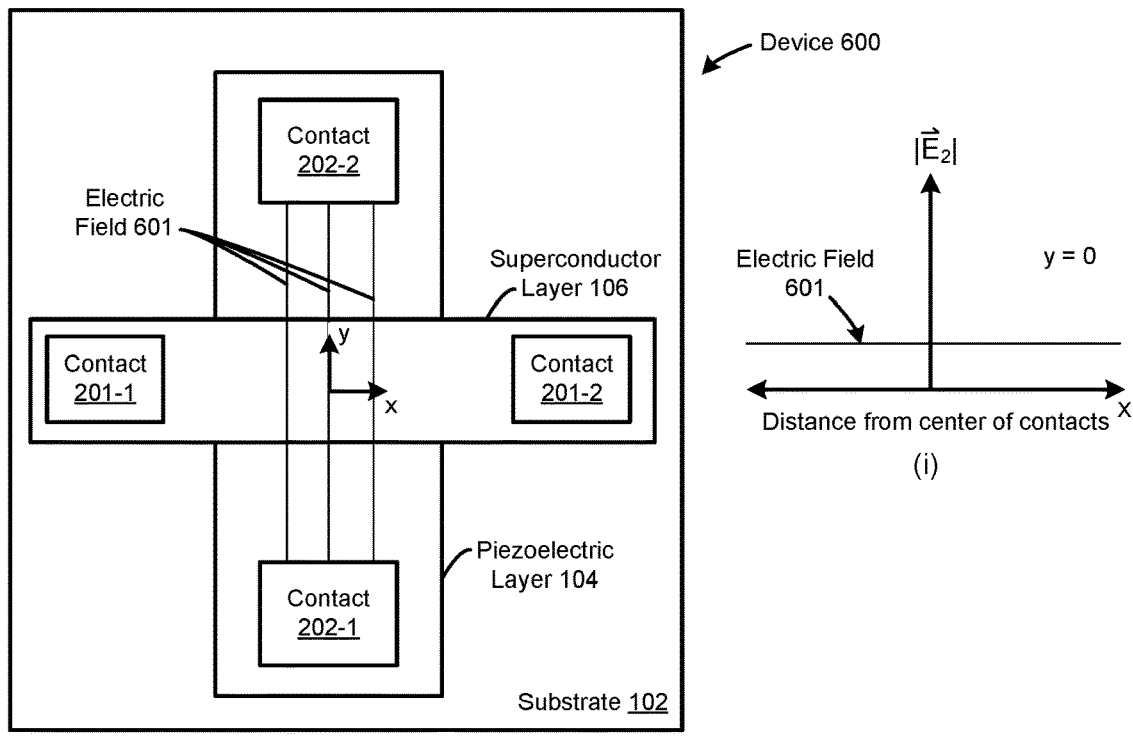
FIGS. 6A-6B are diagrams illustrating representative superconducting switch devices in accordance with some embodiments.
Figure 6B:
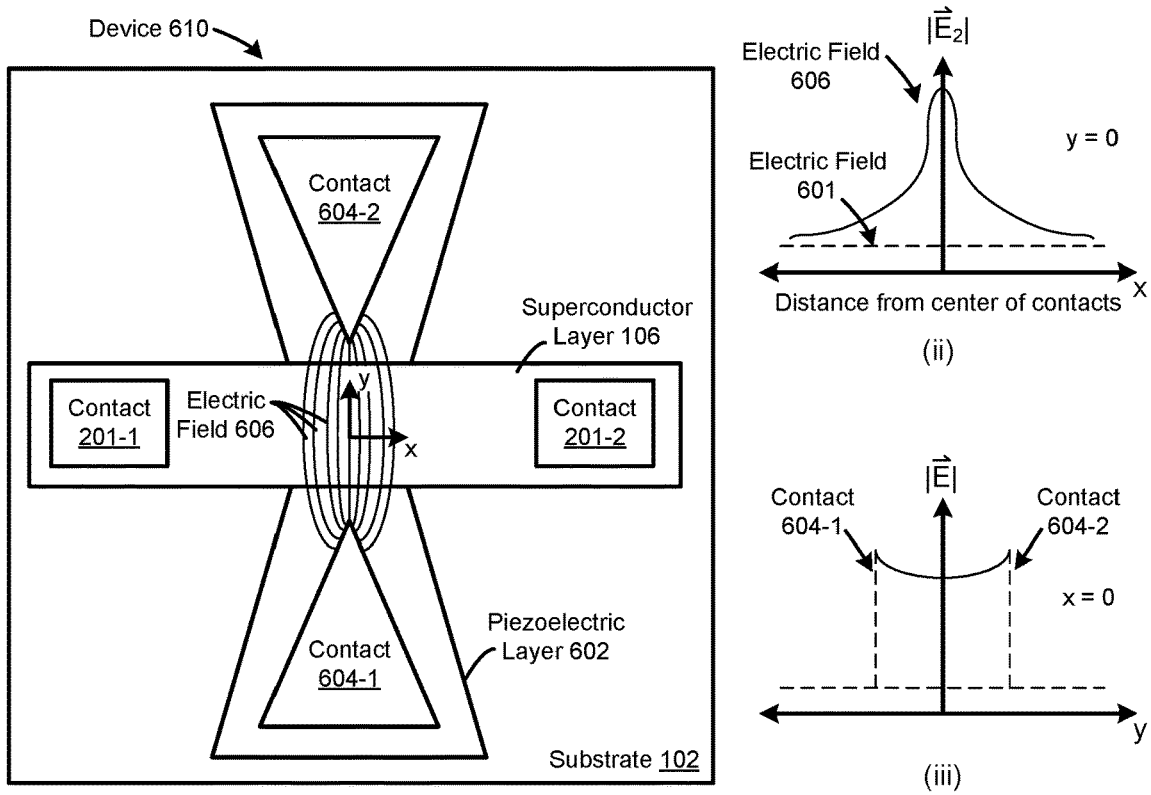

FIGS. 6A-6B are diagrams illustrating representative superconducting switch devices in accordance with some embodiments. FIG. 6A shows a switch device 600 having a piezoelectric layer 104 with (rectangular) contacts 202 and a superconductor layer 106 with contacts 201, e.g., the device 600 is similar to the device 200 in FIG. 2A. FIG. 6A also shows an electric field 601 between the contacts 202-1 and 202-2 due to a voltage difference between the contacts, e.g., from a voltage supplied by a voltage source such as voltage source 406 in FIG. 4A. FIG. 6A also includes a prophetic graph (i) showing the strength of the electric field as a function of horizontal distance from the center of the contacts 202 (along the x axis). As shown in graph (i), the electric field is substantially constant along the width of the contacts 202.

FIG. 6B shows a switch device 610 having a piezoelectric layer 602 with (triangular) contacts 604 (e.g., contacts 604-1 and 604-2) and a superconductor layer 106 with contacts 201. The narrowing of the piezoelectric layer 602 in proximity to the superconductor layer 106 focuses a strain applied to the superconductor layer 106 in accordance with some embodiments. The narrowing of the contacts 604 in proximity to the superconductor layer 106 focuses an electric field 606 applied to the superconductor layer 106 in accordance with some embodiments. In some embodiments, the piezoelectric layer 602 and the contacts 604 are shaped and arranged to provide field emission tip enhancement effects to the superconductor layer 106. The shape and arrangement of the piezoelectric layer 602 and the contacts 604 allow a transition of the superconductor layer 106 from the superconducting state to the non-superconducting state with less voltage supplied (e.g., reducing power requirements and potentially extending device life) as compared to the device 600 in FIG. 6A. FIG. 6B also includes a prophetic graph (ii) showing the strength of the electric field 606 as a function of horizontal distance from the center of the contacts 604 (along the x axis). As shown in graph (ii), the electric field 606 is substantially concentrated at a center of the contacts 604 (e.g., resulting in a 10 times, 100 times, or 1000 times enhancement). FIG. 6B further shows a prophetic graph (iii) showing the strength of the electric field 606 as a function of vertical distance from a center point between the contacts 604 (along the y axis).

Figure 7A:
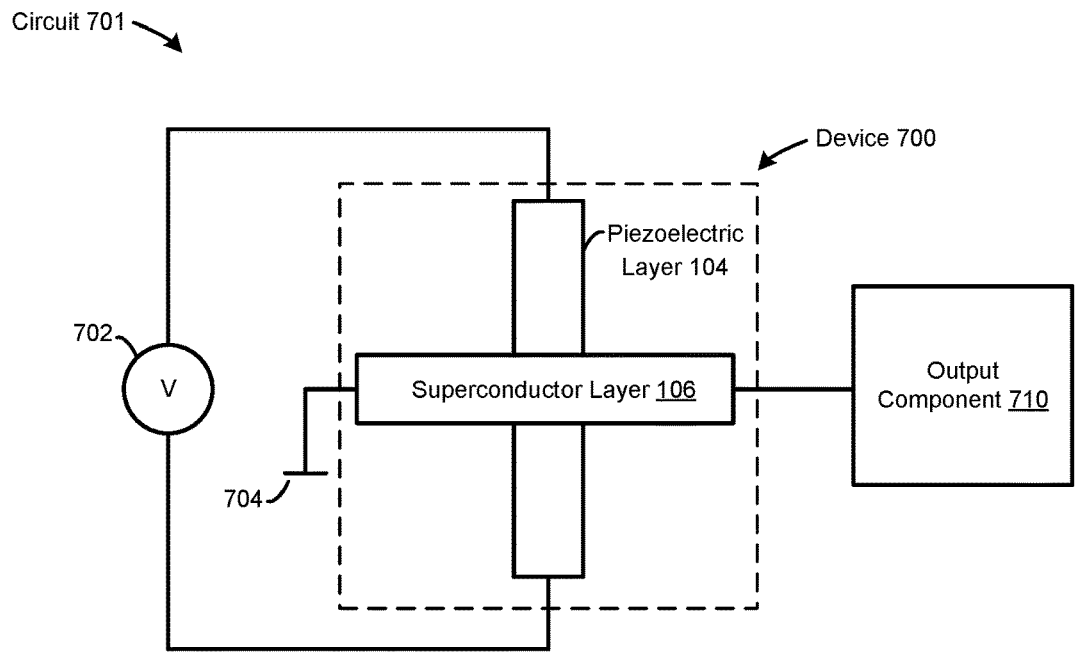
FIGS. 7A-7E illustrate representative circuits including an SIT switch device in accordance with some embodiments.
Figure 7B:
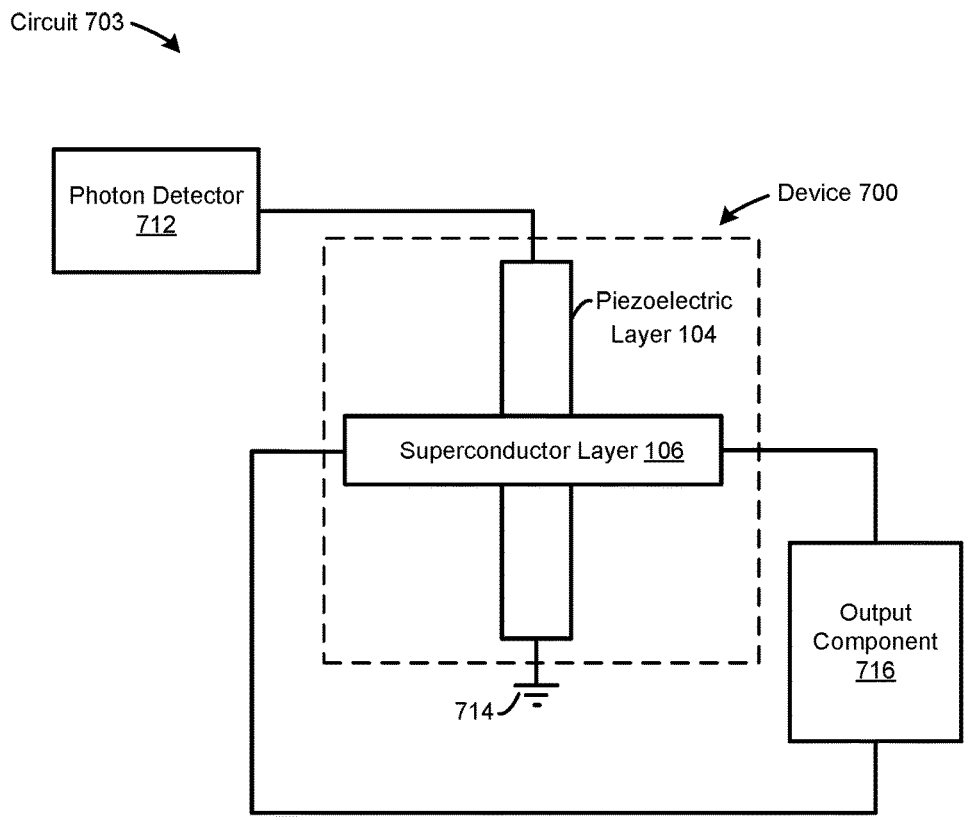
Figure 7C:
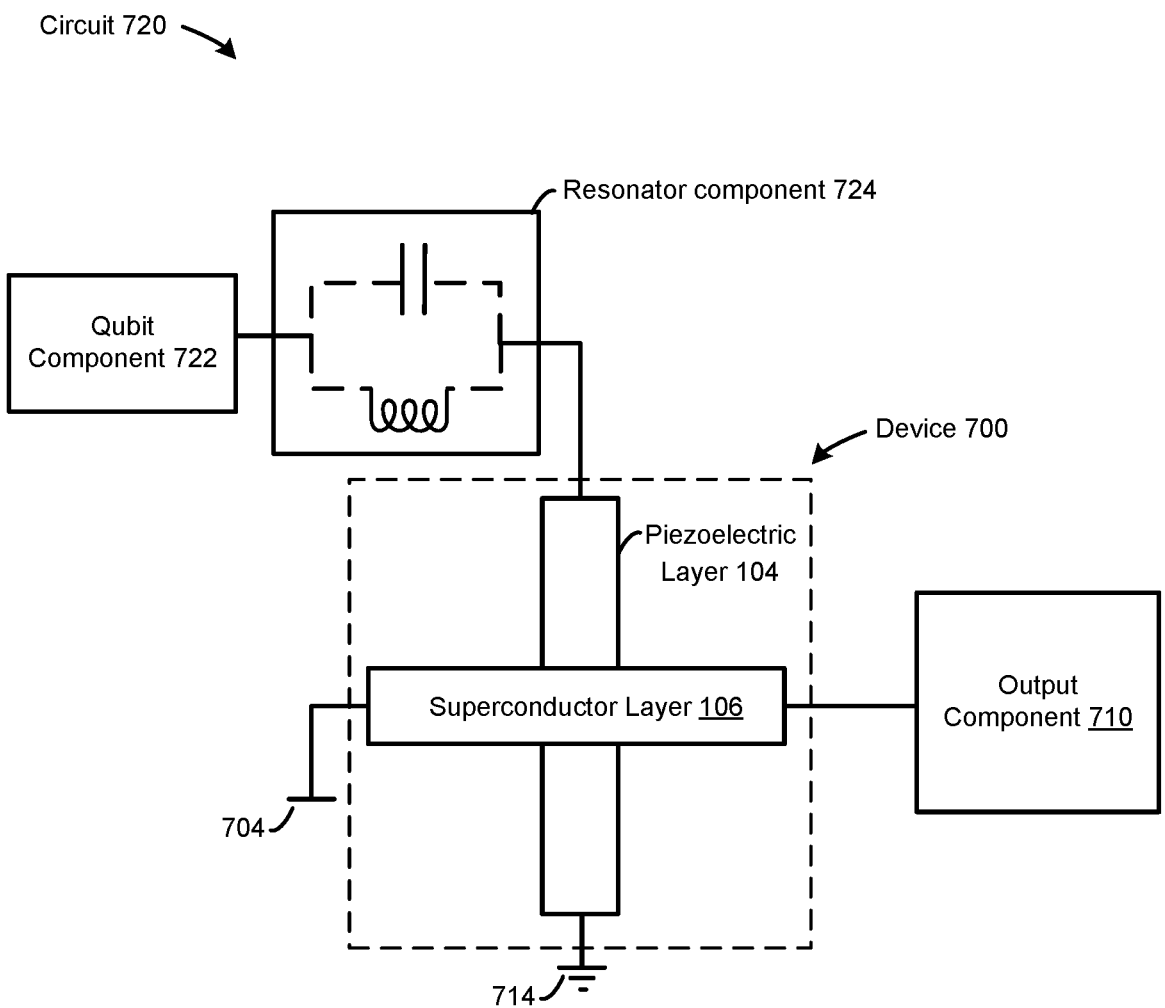

FIGS. 7A-7C illustrate representative circuits including an SIT switch device in accordance with some embodiments. FIG. 7A shows a circuit 701 including a switch device 700 (e.g., any of the switch devices 100, 110, 120, 200, 400, 500, 510, 600, and 610 described previously) having a piezoelectric layer 104 and a superconductor layer 106. The circuit 701 also includes a voltage source 702 coupled to the piezoelectric layer 104 (e.g., via contacts 202 or 604). In some embodiments, the voltage source 702 is configured to supply a first voltage sufficient to cause a transition of the superconductor layer 106 from a superconducting state to an insulating state. In some embodiments, the voltage source 702 is configured to supply a voltage in the range of 100 millivolts to 1 volt. In some embodiments, the voltage source 702 is a transient voltage source. In some embodiments, the voltage source 702 is a photon detection component. In some embodiments, the voltage source 702 is a superconducting qubit component.

The circuit 701 further includes an output component 710 coupled to a first end of the superconductor layer 106 (e.g., via a first contact 201) and a reference node 704 (e.g., a node having a constant voltage) coupled to a second end of the superconductor layer 106 (e.g., via a second contact 201). In some embodiments, the switch device 700 is maintained at temperature(s) below a superconducting threshold temperature for the superconductor layer 106 (e.g., below $T_{C1}$ in FIG. 3B). For example, the switch device (and optionally the circuit 701 or 703) is maintained at any temperature between 0 Kelvin and the superconducting threshold temperature.

In some embodiments, the output component 710 is configured to detect and/or respond to a voltage drop across the superconductor layer 106, e.g., resulting from the superconductor layer 106 transitioning from the superconducting state to the insulating state. For example, the superconductor layer 106 operating in the superconducting state corresponds to a first logical state (e.g., a logical "1", or on state) of the output component 710 (or, equivalently, a first logical state of circuit 701), and the superconductor layer 106 operating in the insulating state corresponds to a second logical state (e.g., a logical "0", or off state) of the output component 710 (or, equivalently, a second logical state of circuit 701), distinct from the first logical state. In this example, the output component 710 may be a logic circuit having different outputs based on whether the switch device 700 is on or off.

In some embodiments, output component 710 includes one or more superconductor and/or semiconductor components. In some embodiments, output component 710 is configured to transition between a second logical state that indicates that the resistance of superconductor layer 106 is greater than a predefined resistance threshold and a first logical state that indicates that the resistance of superconductor layer 106 is less than the predefined resistance threshold, and thereby facilitates providing a logical state value to other circuits or system components. In some embodiments, output component 710 is configured to measure a current flowing through superconductor layer 106, an impedance of the superconductor layer 106, or a voltage drop over superconductor layer 106. For example, in some embodiments, output component 710 is a voltage readout circuit. In some embodiments, output component 710 includes a resistor (e.g., 50 ohms) and the readout circuit is configured to measure a voltage drop over the resistor. In some embodiments, output component 710 includes a voltage source and/or a current source.

An example of an operating sequence for the circuit 701 is given. In this example, at a first time, the voltage source 702 supplies a voltage below a voltage threshold (e.g., supplies no voltage) and the superconductor layer 106 operates in the superconducting state, corresponding to the switch device 700 operating in the steady state. At a second time, the voltage source 702 supplies a voltage above the voltage threshold (e.g., a voltage in the range of 100 mV to 1 V), which causes the piezoelectric layer 104 to apply a corresponding strain on the superconductor layer 106. The strain applied by the piezoelectric layer 104 causes the superconductor layer 106 to transition from the superconducting state to the insulating state, corresponding to the switch device 700 switching to the off state. The output component 716 then detects and/or responds to the change in state of the switch device 700.

FIG. 7B shows a circuit 703 including the switch device 700, a photon detector 712 and reference node 714 coupled to the piezoelectric layer 104 (e.g., via contacts 202 or 604), and an output component 716 coupled to the superconductor layer 106 (e.g., via contacts 201). In some embodiments, the photon detector 712 is configured to supply a first voltage in response to incident light (e.g., incident light meeting one or more criteria, such as an intensity threshold). In some embodiments, the first voltage is sufficient to cause a transition of the superconductor layer 106 from the superconducting state to the insulating state.

In some embodiments, the photon detector 712 is configured to detect single photons. In some embodiments, the photon detector 712 is a semiconductor photodetector (e.g., a photodiode that includes silicon, germanium, indium gallium arsenide, lead sulfide, and/or mercury cadmium telluride). In some embodiments, semiconductor photodetector is voltage-biased (e.g., using an optional voltage source). In some embodiments, the semiconductor photodetector is configured to generate photoelectrons upon receiving light, and the generated photoelectrons create a voltage differential across the piezoelectric layer 104. In some embodiments, the voltage differential elongates the piezoelectric layer 104 and generates a strain on the superconductor layer 106 sufficient to transition the superconductor layer 106 to the insulating state. In some embodiments, the semiconductor photodetector is directly coupled (e.g., physically adjacent) to piezoelectric layer 104. In some embodiments, the semiconductor photodetector is coupled to piezoelectric layer 104 via one or more electrical components (e.g., wires, resistors, inductors, etc.).

In some embodiments, the photon detector 712 is a superconducting photodetector. In some embodiments, the photon detector 712 includes a superconducting wire and a resistive component (e.g., a resistor). In some embodiments, the resistive component of the photon detector is configured to prevent current flow to the piezoelectric layer 104 while the superconducting wire of the photon detector is in the superconducting state. In some embodiments, the superconducting photodetector is configured to transition from the superconducting state to the non-superconducting state in response to incident photon(s) meeting certain criteria. In some embodiments, current is redirected from the superconducting wire of the photon detector through the resistive component to the piezoelectric layer 104 while the superconducting wire of the photon detector is in the non-superconducting state. In some embodiments, the redirected current elongates the piezoelectric layer 104 and generates a strain on the superconductor layer 106 sufficient to transition the superconductor layer 106 to the insulating state.

In some embodiments, output component 716 includes one or more superconductor and/or semiconductor components. In some embodiments, output component 716 is configured to transition between a second logical state (e.g., a logical "0", or off state) that indicates that a resistance of superconductor layer 106 is greater than a predefined resistance threshold and a first logical state (e.g., a logical "1", steady state, or on state), distinct from the second logical state, that indicates that the resistance of superconductor layer 106 is less than the predefined resistance threshold, and thereby facilitates providing the logical state to other circuits or system components. In some embodiments, output component 716 is configured to measure a current flowing through superconductor layer 106, an impedance of the superconductor layer 106, or a voltage drop over superconductor layer 106. For example, in some embodiments, output component 716 is a voltage readout circuit. In some embodiments, output component 716 includes a resistor (e.g., 50 ohms) and the readout circuit is configured to measure a voltage drop over the resistor. In some embodiments, output component 716 includes a voltage source and/or a current source.

An example of an operating sequence for the circuit 703 is given. In this example, at a first time, photon(s) meeting one or more criteria are not detected by the photon detector 712 and thus the photon detector 712 supplies a voltage below a voltage threshold (e.g., supplies no voltage) and the superconductor layer 106 operates in the superconducting state, corresponding to the switch device 700 operating in the steady state. At a second time, the photon detector 712 detects photon(s) meeting the one or more criteria and supplies a voltage above the voltage threshold (e.g., a voltage in the range of 100 mV to 1 V) to the piezoelectric layer 104, which causes the piezoelectric layer 104 to apply a corresponding strain on the superconductor layer 106. The strain applied by the piezoelectric layer 104 causes the superconductor layer 106 to transition from the superconducting state to the insulating state, corresponding to the switch device 700 switching to the off state. The output component 716 detects and/or responds to the change in state of the switch device 700.

FIG. 7C shows a circuit 720 including the switch device 700. The circuit 720 includes a qubit component 722, a resonator component 724, and a reference node 714 (e.g., an electrical ground) coupled to the piezoelectric layer 104 (e.g., via contacts 202 or 604). The circuit 720 further includes a reference node 704 and an output component 710 coupled to the superconductor layer 106 (e.g., via contacts 201). In some embodiments, the qubit component 722 includes a transmon qubit device, an Xmon qubit device, and/or a Josephson junction device. In some embodiments, the qubit component 722 and the resonator component 724 are configured to supply a first voltage (e.g., when reading out a qubit state) to the device 700. In some embodiments, the first voltage is sufficient to cause a transition of the superconductor layer 106 from the superconducting state to the insulating state. In some embodiments (not shown), the resonator component 724 is not included in the circuit 720, e.g., the qubit component 722 is directly connected to the device 700, or the qubit component 722 is coupled via another component to the device 700.

Figure 7D:
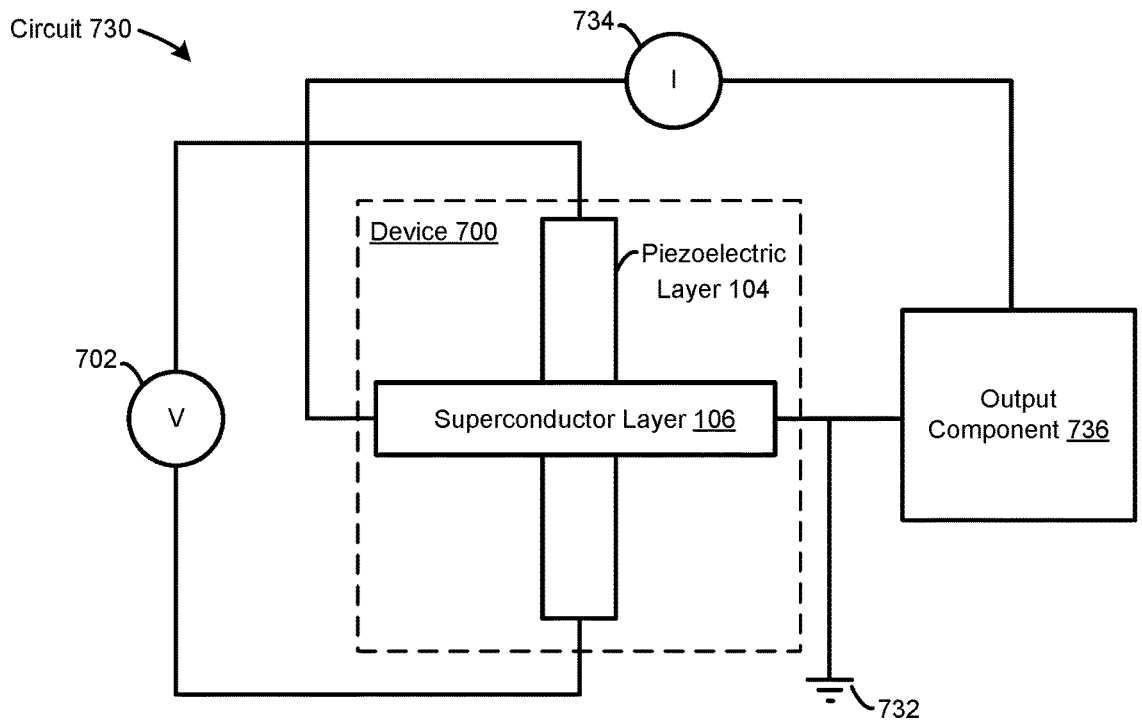
Figure 7E:
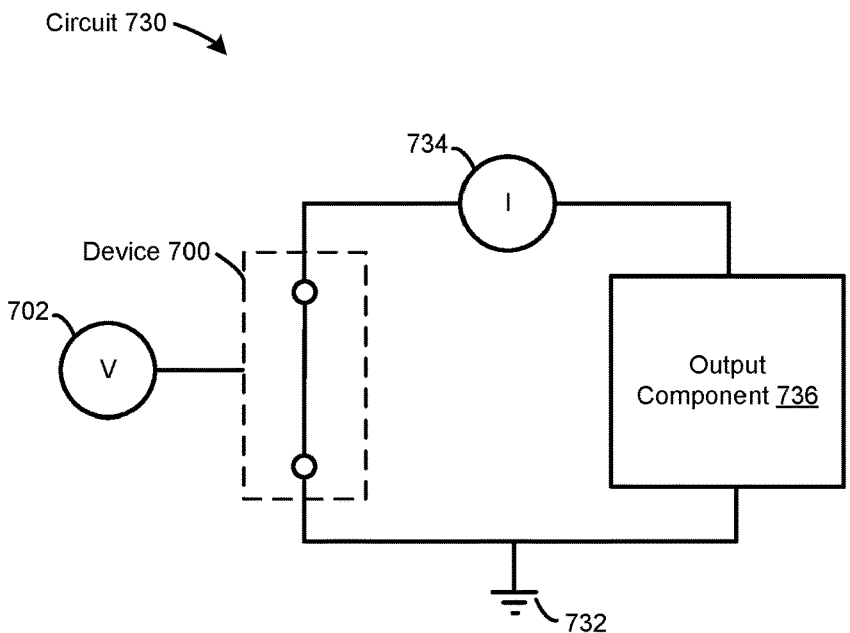

FIG. 7D shows a circuit 730 including the switch device 700. The circuit 730 includes the voltage source 702 coupled to the piezoelectric layer 104 (e.g., via contacts 202 or 604). The circuit 730 further includes a current source 734 and a reference node 732 (e.g., an electrical ground) coupled to the superconductor layer 106 (e.g., via contacts 201), and an output component 736 coupled in parallel with the superconductor layer 106. FIG. 7E shows the circuit 730 with the device 700 represented as a switch.

Figure 7F:
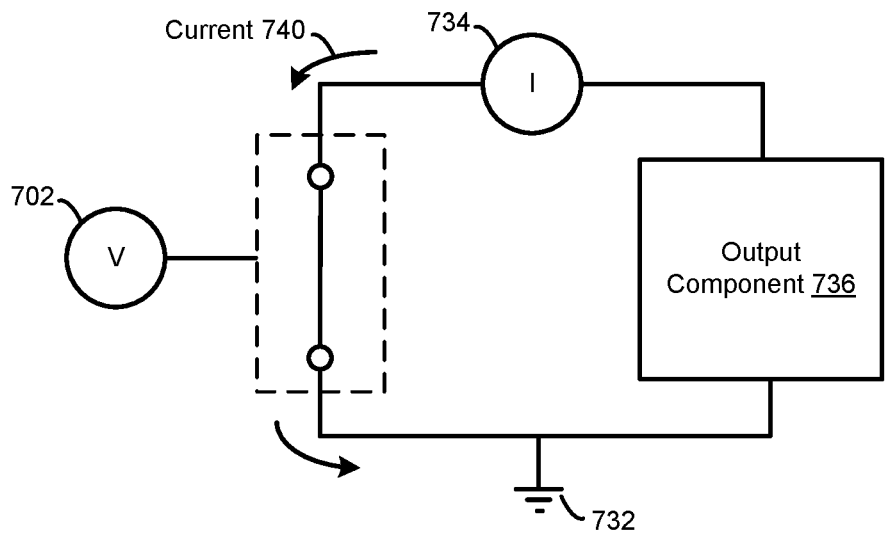
FIGS. 7F-7G illustrate operating states of the switch device of FIG. 7E in accordance with some embodiments.
Figure 7G:
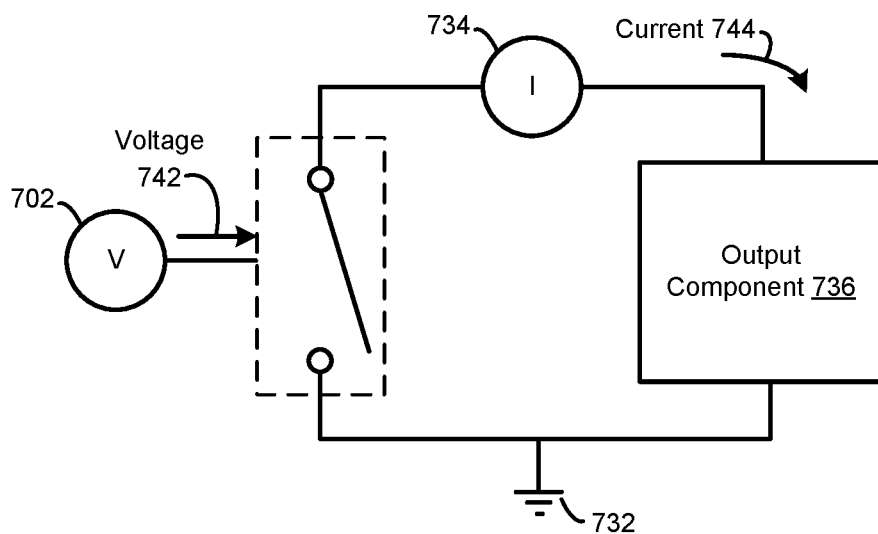

FIGS. 7F-7G show operating states of the switch device 700 in accordance with some embodiments. FIG. 7F shows the switch device 700 operating in a steady state (also sometimes called an 'on state'). In the steady state, the superconductor layer 106 is in the superconducting state (e.g., is maintained at a temperature below a superconducting threshold temperature and is supplied with a current below a superconducting current threshold) and thus has zero resistance. In accordance with some embodiments, the output component 736 has a non-zero resistance and thus the current 740 from the current source 734 flows through the superconductor layer 106 of the device 700 to the reference node 732.

FIG. 7G shows the switch device 700 operating in an off state in response to a voltage 742 supplied by the voltage source 702. In the off state, the superconductor layer 106 is in the insulating state and thus has a non-zero resistance (e.g., a resistance in the range of 1 kOhms to 500 kOhms). Because the superconductor layer 106 has a non-zero resistance, a current 744 (e.g., a portion of the current 740) from the current source 734 is redirected from flowing through the switch device 700 to flowing through the output component 736. In some embodiments, the voltage 742 is applied to the piezoelectric layer 104 of the switch device 700 and causes the piezoelectric layer 104 to expand (e.g., as illustrated in FIG. 4B). In some embodiments, the expansion of the piezoelectric layer 104 introduces a strain on the superconductor layer 106 that is sufficient to transition the superconductor layer from the superconducting state to the insulating state (e.g., as discussed above with respect to FIGS. 3B-3C).

Figure 8:
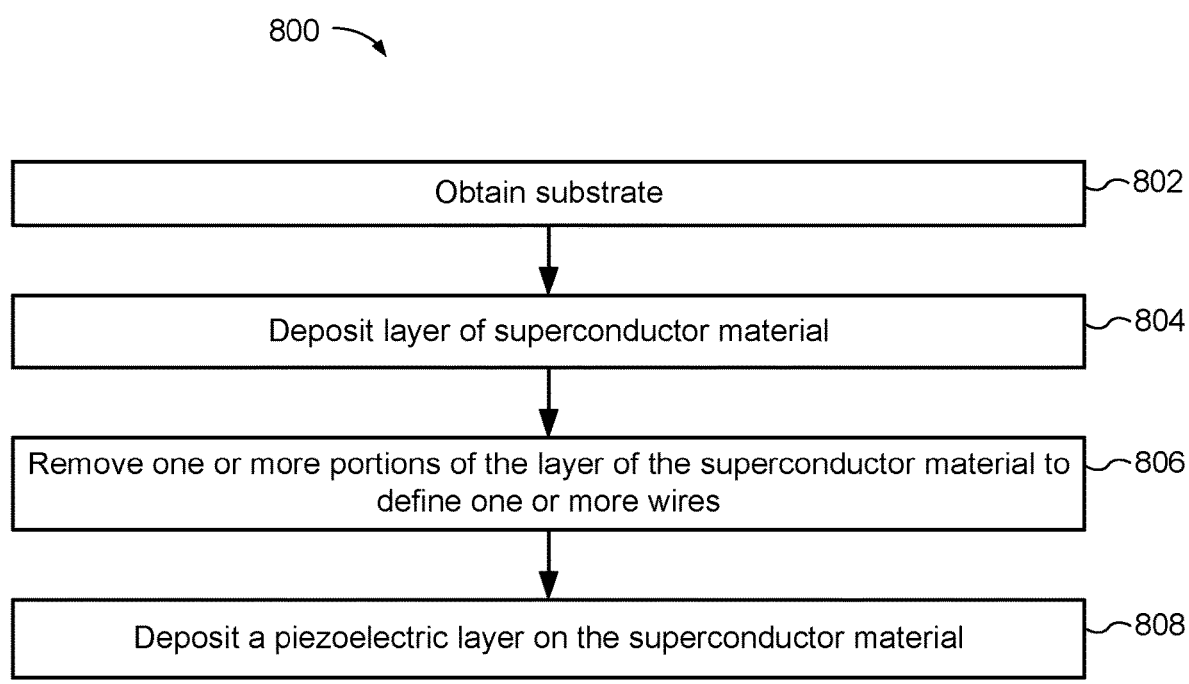
FIG. 8 is a flow diagram illustrating a representative method of fabricating a superconducting switch device in accordance with some embodiments.

FIG. 8 is a flow diagram illustrating a method 800 of fabricating a superconducting switch device in accordance with some embodiments. In some embodiments, the superconducting switch device comprises any of the switch devices 100, 110, 120, 200, 400, 500, 510, 600, 610, and 700 described previously. In some embodiments, the method 800 is performed within a vacuum system (e.g., with a pressure below $10^{-5}$, $10^{-7}$, or $10^{-9}$ Torr). In some embodiments, the method 800 is performed under vacuum, e.g., while maintaining a vacuum state (e.g., with an atmospheric pressure below $10^{-5}$ Torr) around the substrate. In some embodiments, the method 800 is performed without breaking the vacuum state. For example, operations 804 through 808 are performed without removing the vacuum state (e.g., without removing the substrate from the vacuum system or releasing the vacuum within the vacuum system).

A substrate is obtained (802). In some embodiments, the substrate is composed of germanium. In some embodiments, the substrate is a silicon-based substrate, such as a silicon nitride (SiN) substrate. In some embodiments, the substrate does not include an oxide layer, so as to reduce or prevent oxidation of a superconducting material.

A layer of superconductor material is deposited (804) on the substrate. In some embodiments, the superconductor material is niobium or a niobium alloy, such as niobium nitride. In some embodiments, the superconductor material is niobium-germanium (also referred to herein as niobium germanide or $Nb_xGe$). In some embodiments, the layer of superconductor material is deposited at a temperature between 400 and 800° Celsius. In some embodiments, the layer of superconductor material is deposited by sputtering. In some embodiments, the method of manufacture for the superconductor material layer is fully CMOS BEOL (back end of line) compatible, with a growth temperature of 400° Celsius or less. In some embodiments, the superconductor material is deposited on the substrate as a thin film (e.g., a film having a thickness less than 100 nm, 50 nm, or 20 nm).

One or more portions of the layer of superconductor material is removed (806) to define one or more wires. In some embodiments, the portion(s) of the layer of superconductor material is removed via etching (e.g., dry etching or wet etching). In some embodiments, removing the one or more portions includes: (1) depositing a patterned resist layer; and (2) etching away the portions of the superconductor material not covered by the resist layer.

A piezoelectric layer is deposited (808) on the superconductor material. In some embodiments, the piezoelectric layer is composed of aluminum nitride. In some embodiments, the piezoelectric layer is lattice-matched to the layer of superconductor material. In some embodiments, the piezoelectric layer comprises a passivation layer. In some embodiments, the piezoelectric layer consists essentially of a dielectric material. In some embodiments, the piezoelectric layer does not include an oxide layer, so as to reduce, inhibit, or prevent oxidation of the superconducting material. In some embodiments, the piezoelectric layer is deposited at a temperature between 400 and 800° Celsius. In some embodiments, the piezoelectric layer is deposited by sputtering. In some embodiments, the method of manufacture for the piezoelectric layer is fully CMOS BEOL (back end of line) compatible, with a growth temperature of 400° Celsius or less.

In some embodiments, the layer of superconductor material and the piezoelectric layer are annealed. In some embodiments, the layer of superconductor material and the piezoelectric layer are annealed at a temperature between 800° and 1500° Celsius. In some embodiments, the layer of superconductor material and the piezoelectric layer are annealed in a nitrogen gas or vacuum environment. In some embodiments, the layer of superconductor material is annealed independently of the piezoelectric layer (e.g., without annealing the piezoelectric layer).

In some embodiments, a protective layer is deposited over the layer of superconductor material (and optionally over the piezoelectric layer). In some embodiments, the protective layer is deposited before the one or more portions of the layer of superconductor material are removed to define the one or more wires.

Figure 9:
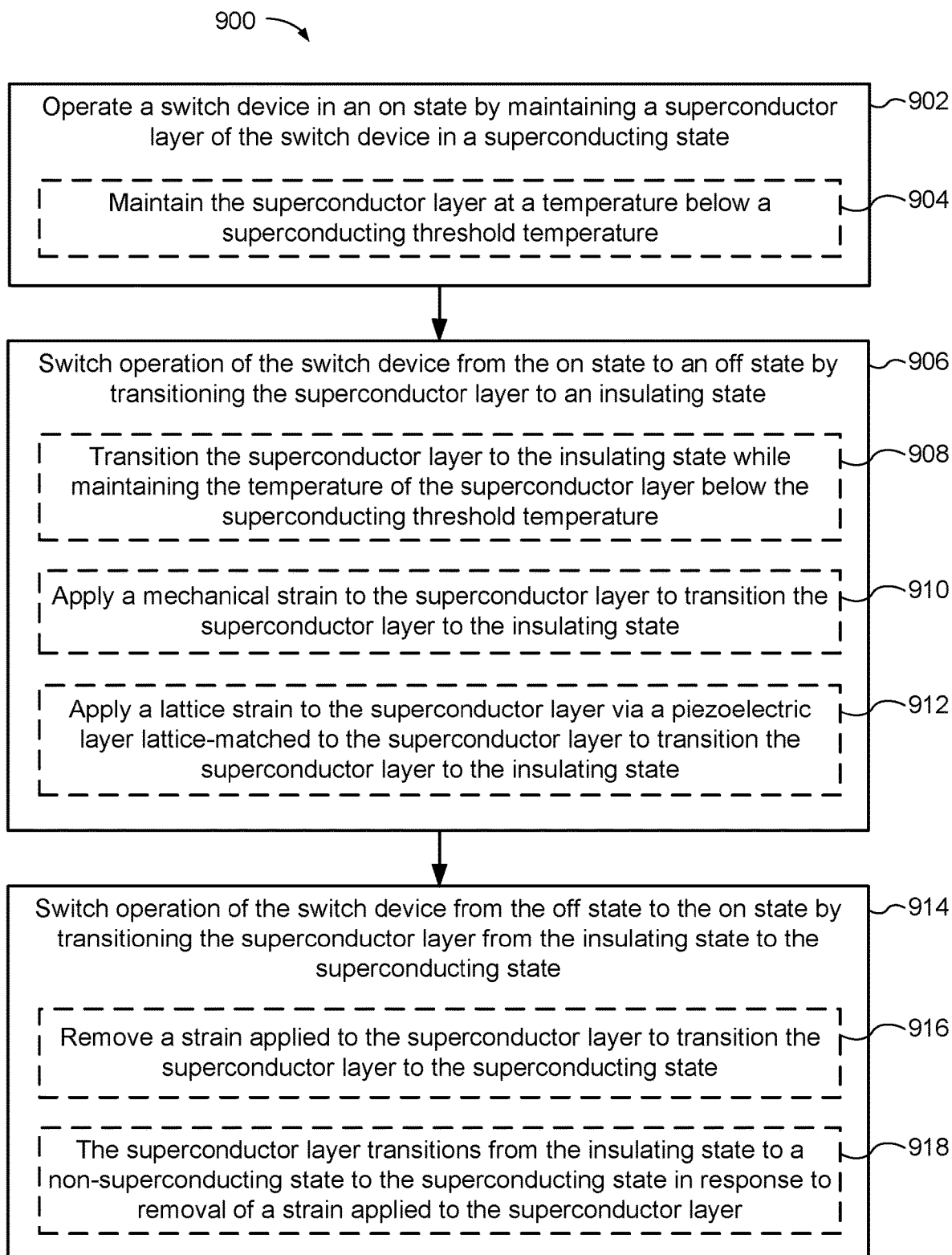
FIG. 9 is a flow diagram illustrating a representative method of operating a superconducting switch device in accordance with some embodiments.

FIG. 9 is a flow diagram illustrating a method 900 of operating a superconducting switch device in accordance with some embodiments. In some embodiments, the superconducting switch device comprises any of the switch devices 100, 110, 120, 200, 400, 500, 510, 600, 610, and 700 described previously.

The superconducting switch device (e.g., the device 200, FIG. 2A) is operated (902) in a steady state by maintaining a superconductor layer (e.g., the superconductor layer 106) of the switch device in a superconducting state. In some embodiments, maintaining the superconductor layer in the superconducting state includes maintaining (904) the superconductor layer at a temperature below a superconducting threshold temperature (e.g., below the temperature $T_{C1}$, FIG. 3C). In some embodiments, maintaining the superconductor layer in the superconducting state includes supplying a current to the superconductor layer that is below a superconducting current threshold for the superconductor layer.

Operation of the switch device is switched (906) from the steady state to an off state by transitioning the superconductor layer to an insulating state. In some embodiments, the superconductor layer is transitioned while maintaining (908) a temperature of the superconductor layer below the superconducting threshold temperature (e.g., below the temperature $T_{C1}$, FIG. 3C). In some embodiments, the superconductor layer is transitioned by applying (910) a mechanical strain to the superconductor layer. In some embodiments, the superconductor layer is transitioned by applying (912) a lattice strain to the superconductor layer via a piezoelectric layer (e.g., the piezoelectric layer 104) coupled (e.g., lattice-matched) to the superconductor layer (e.g., as illustrated in FIGS. 4A-4B).

In some embodiments, the lattice strain is generated in response to a voltage supplied to the piezoelectric layer. In some embodiments, the voltage is supplied by a voltage source (e.g., the voltage source 702). In some embodiments, the voltage source includes a current source coupled with a resistor. In some embodiments, the voltage source is, or includes, a photon detection component (e.g., the photon detector 712). In some embodiments, the voltage source is, or includes, a qubit component (e.g., the qubit component

722). In some embodiments, the voltage source includes a resonator component (e.g., the resonator component 724).

Operation of the switch device is switched (914) from the off state to the steady state by transitioning the superconductor layer from the insulating state to the superconducting state. In some embodiments, the superconductor layer is transitioned to the superconducting state by removing (916) a strain applied to the superconductor layer. In some embodiments, the superconductor layer transitions (918) from the insulating state to a non-superconducting state, and then to the superconducting state in response to removal of a strain applied to the superconductor layer (e.g., as illustrated in FIG. 3C). In some embodiments, the superconductor layer transitions from the non-superconducting state to the superconducting state in the absence of a current above a superconducting threshold current supplied to the superconductor layer.

In light of these principles and embodiments, we now turn to certain additional embodiments.

In accordance with some embodiments, an electrical circuit (e.g., the circuit 701, FIG. 7A) includes: (1) a switch device (e.g., the switch device 700) configured to switch between an on state and an off state in response to a first voltage, the switch device including: (a) a superconductor layer (e.g., the superconductor layer 106) adapted to transition from a superconducting state to an insulating state in response to a first strain; and (b) a piezoelectric layer (e.g., the piezoelectric layer 104) positioned adjacent to the superconductor layer, the piezoelectric layer configured to apply the first strain to the superconductor layer in response to the first voltage; (2) a voltage source (e.g., the voltage source 702) electrically coupled to the piezoelectric layer of the switch device and configured to supply the first voltage; and (3) an output component (e.g., the output component 710) coupled to the superconductor layer of the switch device. In some embodiments, the superconductor layer is, or includes, a superconductor wire. In some embodiments, the superconductor layer has a width in the range of 50 nm to 5 micron. In some embodiments, the superconductor layer has a length in the range of 100 nm to 500 micron. In some embodiments, the piezoelectric layer has a width in the range of 50 nm to 50 micron and a length in the range of 100 nm to 500 micron. In some embodiments, the piezoelectric layer has a thickness in the range of 5 nm to 20 nm. In some embodiments, the voltage source is one or more circuit components that selectively output the first voltage (e.g., a photon detection circuit). In some embodiments, the first voltage is in the range of 100 mV to 1 Volt.

In some embodiments, the piezoelectric layer is lattice-matched to the superconductor layer (e.g., as illustrated in FIGS. 4A-4B). In some embodiments, a thickness of the superconductor layer is within 10%, 30%, or 50% of a superconductor-to-insulator transition thickness (e.g., as illustrated in FIG. 1A). For example, the superconductor layer is composed of NbN and has a thickness of 3 nm and the transition thickness for NbN is approximately 2.5 nm, which is based in part on a lattice structure of the superconductor layer.

In some embodiments, the electrical circuit includes a substrate, and the superconductor layer or the piezoelectric layer is deposited on the substrate. In some embodiments, the substrate is composed of silicon, the piezoelectric layer is composed of AlN, and the superconductor layer is composed of NbN. In some embodiments, the piezoelectric layer is a substrate and the superconductor layer is deposited on the piezoelectric substrate.

In some embodiments: (1) the superconductor layer is positioned on top of the piezoelectric layer; and (2) the switch device further includes a second piezoelectric layer positioned on top of the superconductor layer, the second piezoelectric layer configured to apply a second strain to the superconductor layer in response to the first voltage (e.g., as illustrated in FIG. 5A). In some embodiments, the first and second strains are a same amount of strain. In some embodiments, the voltage supplied with two piezoelectric layers is approximately half as much as with a single piezoelectric layer.

In some embodiments, the switch device further includes a second superconductor layer positioned on top of the second piezoelectric layer and coupled in parallel with the superconductor layer (e.g., as illustrated in FIG. 5B). In some embodiments, the switch device includes 'n' superconductor layers coupled in parallel with one another, where n is an integer greater than 1, and at least 'n−1' piezoelectric layers lattice-matched to the superconductor layers (optionally n or n+1 layers).

In some embodiments, the piezoelectric layer is shaped to concentrate strain applied to the superconductor layer (e.g., as illustrated in FIG. 6B). In some embodiments, the set of contacts on the piezoelectric layer are shaped to focus electrical fields (e.g., have a triangular shape with a point facing the superconductor layer) around the superconductor layer (e.g., as illustrated in FIG. 6B). In some embodiments, the piezoelectric layer and/or the contacts are shaped to have a reduced width at locations proximate to the superconductor layer (e.g., a field emission tip enhancement configuration).

In some embodiments, the superconducting layer is maintained at a temperature below a superconducting threshold temperature for the superconducting layer (e.g., any temperature between 0 Kelvin and the superconducting threshold temperature). In some embodiments, the switch device (and optionally the electrical circuit) is also maintained at temperature(s) below the superconducting threshold temperature.

In some embodiments, the piezoelectric layer is positioned and adapted to inhibit oxidation of the superconductor layer. In some embodiments, the superconductor layer and the piezoelectric layer are positioned parallel to one another. In some embodiments, the superconductor layer and the piezoelectric layer are positioned in a non-parallel arrangement. In some embodiments, the piezoelectric layer and the superconductor layer are positioned substantially perpendicular to one another (e.g., within 10% or 20% of perpendicular).

In some embodiments, the switch device is configured such that, while in the insulating state, electron tunneling through the superconductor layer is inhibited. In some embodiments, the insulating portion of the superconductor layer has a width greater than a threshold tunneling width.

In some embodiments, the electrical circuit further includes a set of contacts connected to the piezoelectric layer (e.g., the contacts 202), and the voltage source is electrically coupled to the piezoelectric layer via the set of contacts.

In some embodiments, the output component is configured to measure one or more of: a resistance of the superconductor layer, a current through the superconductor layer, and a voltage drop across the superconductor layer.

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

As used herein, a "superconducting circuit" or "superconductor circuit" is a circuit having one or more superconducting materials. For example, a superconducting photodetector circuit is a photodetector circuit that includes one or more superconducting materials. As used herein, a "superconducting" material is a material that is capable of operating in a superconducting state (under particular conditions). For example, a material that operates as a superconductor (e.g., operates with zero electrical resistance) when cooled below a particular temperature (e.g., a critical temperature) and having less than a threshold current flowing through it. A superconducting material is also called herein a superconduction-capable material. The superconducting materials may also operate in an "off" state where little or no current is present. In some embodiments, the superconducting materials operate in a non-superconducting state during which the materials have a non-zero electrical resistance (e.g., a resistance in the range of one thousand to ten thousand ohms). For example, a superconducting material supplied with a current greater than a threshold superconducting current for the superconducting material may transition from a superconducting state with zero electrical resistance to a non-superconducting state with non-zero electrical resistance. As an example, superconducting wire 104 is a superconducting material that is capable of operating in a superconducting state (e.g., under particular operating conditions).

As used herein, a "wire" is a section of material configured for transferring electrical current. In some embodiments, a wire includes a section of material conditionally capable of transferring electrical current (e.g., a wire made of a superconducting material that is capable of transferring electrical current while the wire is maintained at a temperature below a critical temperature). A cross-section of a wire (e.g., a cross-section that is perpendicular to a length of the wire) optionally has a geometric (e.g., flat or round) shape or an irregular (also sometimes called a non-geometric) shape. In some embodiments, a length of a wire is greater than a width or a thickness of the wire (e.g., the length of a wire is at least 5, 6, 7, 8, 9, or 10 times greater than the width and the thickness of the wire).

As used herein, the term "light intensity" or simply "intensity" refers to the number of photons incident on a unit area, e.g., a superconducting wire, per unit time. The term "intensity" includes a situation where only a single photon is incident on the detector in a given time period and also includes a situation where multiple photons are incident on the detector in the given time period. For example, a first light pulse having a first intensity that is greater than a second light pulse having a second intensity includes a first light pulse that includes more photons than a second light pulse. For example, the first light pulse can include 10 photons or 100 photons, while the second light pulse can include one photon, two photons, . . . , 9 photons, etc.

It will also be understood that, although the terms first, second, etc. are, in some instances, used herein to describe various elements, these elements should not be limited by these terms. These terms are only used to distinguish one element from another. For example, a first layer could be termed a second layer, and, similarly, a second layer could be termed a first layer, without departing from the scope of the various described embodiments. The first layer and the second layer are both layers, but they are not the same layer unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An electrical circuit, comprising:
   a switch device configured to switch between an on state and an off state in response to a first voltage, the switch device comprising:
      a superconductor layer having a thickness relative to a superconductor-to-insulator transition thickness such that the superconducting layer is adapted to transition from a superconducting state to an insulating state in response to a first strain; and
      a piezoelectric layer positioned adjacent to the superconductor layer, the piezoelectric layer configured to apply the first strain to the superconductor layer in response to the first voltage;
   a voltage source electrically coupled to the piezoelectric layer of the switch device and configured to supply the first voltage; and
   an output component coupled to the superconductor layer of the switch device;
   wherein the thickness of the superconductor layer is within 10% of the superconductor-to-insulator transition thickness.

2. The electrical circuit of claim 1, wherein the piezoelectric layer is lattice-matched to the superconductor layer.

3. The electrical circuit of claim 1, wherein the piezoelectric layer is shaped to concentrate electrical fields around the superconductor layer.

4. The electrical circuit of claim 1, wherein the piezoelectric layer is positioned and adapted to inhibit oxidation of the superconductor layer.

5. The electrical circuit of claim 1, wherein the piezoelectric layer and the superconductor layer are positioned substantially perpendicular to one another.

6. The electrical circuit of claim 1, wherein the switch device is configured such that, while in the insulating state, electron tunneling through the superconductor layer is inhibited.

7. The electrical circuit of claim 1, wherein the output component is configured to measure one or more of: a resistance of the superconductor layer, a current through the superconductor layer, and a voltage drop across the superconductor layer.

8. A method comprising:
operating a switch device in a steady state by maintaining a superconductor layer of the switch device in a superconducting state, wherein, in the steady state, current from a current source flows through the superconductor layer; and
switching operation of the switch device from the steady state to an off state by transitioning the superconductor layer to an insulating state, wherein, in the off state, at least a portion of the current from the current source is redirected to an output component;
wherein:
the superconductor layer has a thickness relative to a superconductor-to-insulator transition thickness such that the superconducting layer is adapted to transition from the superconducting state to the insulating state in response to a first strain;
the superconductor layer is transitioned to the insulating state by applying the first strain to the superconductor layer, via a piezoelectric layer coupled to the superconductor layer, while maintaining the superconductor layer at a temperature below a superconducting threshold temperature for the superconductor layer.

9. The method of claim 8, wherein maintaining the superconductor layer in the superconducting state comprises maintaining the superconductor layer at a temperature below the superconducting threshold temperature for the superconductor layer.

10. The method of claim 8, wherein the switch device includes the piezoelectric layer.

11. The method of claim 8, further comprising, while operating the superconductor layer in the insulating state, transitioning the superconductor layer to a non-superconducting conductive state, having lower resistance than the superconductor layer in the insulating state, by removing the first strain.

12. The method of claim 8, wherein, in the steady state, the superconductor layer has zero resistance.

13. An electrical circuit, comprising:
a switch device configured to switch between an on state and an off state in response to a first voltage, the switch device comprising:
a superconductor layer having a thickness relative to a superconductor-to-insulator transition thickness such that the superconducting layer is adapted to transition from a superconducting state to an insulating state in response to a first strain; and
a piezoelectric layer positioned adjacent to the superconductor layer, the piezoelectric layer configured to apply the first strain to the superconductor layer in response to the first voltage;
a voltage source electrically coupled to the piezoelectric layer of the switch device and configured to supply the first voltage; and
an output component coupled to the superconductor layer of the switch device;
wherein the piezoelectric layer is lattice-matched to the superconductor layer.

14. The electrical circuit of claim 13, wherein the piezoelectric layer is shaped to concentrate electrical fields around the superconductor layer.

15. The electrical circuit of claim 13, wherein the piezoelectric layer is positioned and adapted to inhibit oxidation of the superconductor layer.

16. The electrical circuit of claim 13, wherein the piezoelectric layer and the superconductor layer are positioned substantially perpendicular to one another.

17. The electrical circuit of claim 13, wherein the switch device is configured such that, while in the insulating state, electron tunneling through the superconductor layer is inhibited.

18. The electrical circuit of claim 13, wherein the output component is configured to measure one or more of: a resistance of the superconductor layer, a current through the superconductor layer, and a voltage drop across the superconductor layer.

19. The electrical circuit of claim 13, wherein the thickness of the superconductor layer is within 20% of the superconductor-to-insulator transition thickness.

20. An electrical circuit, comprising:
a switch device configured to switch between an on state and an off state in response to a first voltage, the switch device comprising:
a superconductor layer having a thickness relative to a superconductor-to-insulator transition thickness such that the superconducting layer is adapted to transition from a superconducting state to an insulating state in response to a first strain; and
a piezoelectric layer positioned adjacent to the superconductor layer, the piezoelectric layer configured to apply the first strain to the superconductor layer in response to the first voltage;
a voltage source electrically coupled to the piezoelectric layer of the switch device and configured to supply the first voltage; and
an output component coupled to the superconductor layer of the switch device;
wherein the voltage source comprises a superconducting qubit component.

21. The electrical circuit of claim 20, wherein the piezoelectric layer is lattice-matched to the superconductor layer.

22. The electrical circuit of claim 20, wherein the piezoelectric layer is shaped to concentrate electrical fields around the superconductor layer.

23. The electrical circuit of claim 20, wherein the piezoelectric layer is positioned and adapted to inhibit oxidation of the superconductor layer.

24. The electrical circuit of claim 20, wherein the piezoelectric layer and the superconductor layer are positioned substantially perpendicular to one another.

25. The electrical circuit of claim 20, wherein the switch device is configured such that, while in the insulating state, electron tunneling through the superconductor layer is inhibited.

26. The electrical circuit of claim 20, wherein the output component is configured to measure one or more of: a resistance of the superconductor layer, a current through the superconductor layer, and a voltage drop across the superconductor layer.

27. The electrical circuit of claim 20, wherein the thickness of the superconductor layer is within 20% of the superconductor-to-insulator transition thickness.

28. An electrical circuit, comprising:
a switch device configured to switch between an on state and an off state in response to a first voltage, the switch device comprising:
a superconductor layer having a thickness relative to a superconductor-to-insulator transition thickness such that the superconducting layer is adapted to transition from a superconducting state to an insulating state in response to a first strain; and a piezoelectric layer positioned adjacent to the superconductor layer, the piezoelectric layer configured to apply the first strain to the superconductor layer in response to the first voltage;

a voltage source electrically coupled to the piezoelectric layer of the switch device and configured to supply the first voltage; and an output component coupled to the superconductor layer of the switch device;

wherein the superconductor layer is positioned on top of the piezoelectric layer; and the switch device further comprises a second piezoelectric layer positioned on top of the superconductor layer, the second piezoelectric layer configured to apply a second strain to the superconductor layer in response to the first voltage.

29. The electrical circuit of claim 28, wherein the piezoelectric layer is lattice-matched to the superconductor layer.

30. The electrical circuit of claim 28, wherein the piezoelectric layer is shaped to concentrate electrical fields around the superconductor layer.

31. The electrical circuit of claim 28, wherein the piezoelectric layer is positioned and adapted to inhibit oxidation of the superconductor layer.

32. The electrical circuit of claim 28, wherein the piezoelectric layer and the superconductor layer are positioned substantially perpendicular to one another.

33. The electrical circuit of claim 28, wherein the switch device is configured such that, while in the insulating state, electron tunneling through the superconductor layer is inhibited.

34. The electrical circuit of claim 28, wherein the output component is configured to measure one or more of: a resistance of the superconductor layer, a current through the superconductor layer, and a voltage drop across the superconductor layer.

35. The electrical circuit of claim 28, wherein the switch device further comprises a second superconductor layer positioned on top of the second piezoelectric layer and coupled in parallel with the superconductor layer.

36. The electrical circuit of claim 28, wherein the thickness of the superconductor layer is within 20% of the superconductor-to-insulator transition thickness.

* * * * *